(12) United States Patent
Ashihara et al.

(10) Patent No.: US 11,996,311 B2
(45) Date of Patent: May 28, 2024

(54) SUBSTRATE PROCESSING APPARATUS, METHOD OF PROCESSING SUBSTRATE, METHOD OF MANUFACTURING SEMICONDUCTOR DEVICE, AND RECORDING MEDIUM

(71) Applicant: Kokusai Electric Corporation, Tokyo (JP)

(72) Inventors: Hiroshi Ashihara, Tokyo (JP); Yuji Takebayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/955,758

(22) Filed: Sep. 29, 2022

(65) Prior Publication Data

US 2023/0298918 A1 Sep. 21, 2023

(30) Foreign Application Priority Data

Mar. 18, 2022 (JP) .................................. 2022-044565

(51) Int. Cl.
*H01L 21/677* (2006.01)
*H01L 21/67* (2006.01)
*H01L 21/687* (2006.01)

(52) U.S. Cl.
CPC .. *H01L 21/67712* (2013.01); *H01L 21/67173* (2013.01); *H01L 21/67201* (2013.01);
(Continued)

(58) Field of Classification Search
CPC ......... H01L 21/67712; H01L 21/67201; H01L 21/67745; H01L 21/68764;
(Continued)

(56) References Cited

U.S. PATENT DOCUMENTS 4,938,691 A * 7/1990 Ohkase ................. C30B 31/103
414/172
5,180,273 A * 1/1993 Sakaya ............. H01L 21/67781
414/940
(Continued)

FOREIGN PATENT DOCUMENTS

JP 01-253232 A 10/1989
JP 04-099315 A 3/1992
(Continued)

OTHER PUBLICATIONS

Japanese Office Action dated Nov. 14, 2023 for Japanese Patent Application No. 2022-044565.
(Continued)

*Primary Examiner* — Glenn F Myers
(74) *Attorney, Agent, or Firm* — Volpe Koenig

(57) ABSTRACT

There is provided a technique that includes: at least one process chamber in which at least one substrate is processed; a mounting stage configured to be capable of mounting the at least one substrate on the mounting stage; a transport chamber including a conveyor configured to be capable of holding the mounting stage at least two places in a vertical direction and transporting the mounting stage; and a controller configured to be capable of performing a transport control of the conveyor in the transport chamber.

17 Claims, 23 Drawing Sheets

(52) U.S. Cl.
CPC .. *H01L 21/67736* (2013.01); *H01L 21/67745* (2013.01); *H01L 21/68764* (2013.01)

(58) Field of Classification Search
CPC ......... H01L 21/67313; H01L 21/67303; H01L 21/67754; H01L 21/67757; H01L 21/67742; H01L 21/67739; H01L 21/6773; G05B 19/4189; G06Q 10/08
USPC .......................................................... 700/112
See application file for complete search history.

(56) References Cited

U.S. PATENT DOCUMENTS

| | | | |
|---|---|---|---|
| 5,234,528 A | | 8/1993 | Nishi |
| 5,236,295 A | * | 8/1993 | Ishii .................. H01L 21/67778 901/30 |
| 5,356,261 A | * | 10/1994 | Nishi ...................... H01L 21/68 414/940 |
| 2013/0247937 A1 | * | 9/2013 | Nunomura ........ H01L 21/67069 156/345.24 |
| 2018/0342412 A1 | | 11/2018 | Miyoshi |
| 2022/0199443 A1 | | 6/2022 | Takebayashi et al. |

FOREIGN PATENT DOCUMENTS

| | | |
|---|---|---|
| JP | 04-133314 A | 5/1992 |
| JP | 04-154118 A | 5/1992 |
| JP | 2004-071618 A | 3/2004 |
| JP | 2007-294755 A | 11/2007 |
| TW | 202127542 A | 7/2021 |
| WO | 2017/134853 A1 | 8/2017 |

OTHER PUBLICATIONS

Taiwan Office Action dated May 26, 2023 for Taiwan Patent Application No. 111131595.

* cited by examiner

In normal operation
Substrate processing schedule
Process chamber 1
Process chamber 2
Process chamber 3

Transport schedule

| Order | Process chamber |
|---|---|
| 1 | Process chamber 2 |
| 2 | Process chamber 1 |
| 3 | Process chamber 3 |

Transport schedule

| Order | Process chamber |
|---|---|
| 1 | Process chamber 2 |
| 2 | Process chamber 1 |
| 3 | Process chamber 3 |

When abnormality occurs
Substrate processing schedule
Process chamber 1
Process chamber 2
Process chamber 3

Transport schedule

| Order | Process chamber |
|---|---|
| 1 | Process chamber 1 |
| 2 | Process chamber 3 |
| 3 | Process chamber 2 |

Transport schedule

| Order | Process chamber |
|---|---|
| 1 | Process chamber 1 |
| 2 | Process chamber 3 |
| 3 | Process chamber 2 |

SUBSTRATE PROCESSING APPARATUS, METHOD OF PROCESSING SUBSTRATE, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2022-044565, filed on Mar. 18, 2022, the entire contents of which are incorporated herein by reference.

TECHNICAL FIELD

The present disclosure relates to a substrate processing apparatus, a method of processing a substrate, a method of manufacturing a semiconductor device, and a recording medium.

BACKGROUND

A batch-type substrate processing apparatus including a plurality of process chambers is known. In the batch-type substrate processing apparatus, it takes a long time to transport a substrate. Therefore, a technique of transporting a mounting stage on which a substrate is mounted, instead of transporting the substrate, is devised.

When the mounting stage is transported by using a lower side of the mounting stage as a fulcrum, a large stress is applied to an upper side of the mounting stage when the mounting stage is transported (moved) and stopped. When the large stress is applied to the upper side of the mounting stage in this manner, the substrate mounted on the mounting stage may be displaced. Therefore, acceleration and deceleration when the mounting stage is transported are reduced.

SUMMARY

Some embodiments of the present disclosure provide a technique capable of suppressing displacement of a substrate when a mounting stage on which the substrate is mounted is transported and stopped.

According to some embodiments of the present disclosure, there is provided a technique that includes: at least one process chamber in which at least one substrate is processed; a mounting stage configured to be capable of mounting the at least one substrate on the mounting stage; a transport chamber including a conveyor configured to be capable of holding the mounting stage at least two places in a vertical direction and transporting the mounting stage; and a controller configured to be capable of performing a transport control of the conveyor in the transport chamber.

BRIEF DESCRIPTION OF DRAWINGS

The accompanying drawings, which are incorporated in and constitute a portion of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the present disclosure will now be described with reference to the drawings. The drawings used in the following description are schematic, and dimensional relationships, ratios, and the like of various components shown in figures may not match actual ones. Further, dimensional relationships, ratios, and the like of various components among plural figures may not match one another.

Substrate Processing Apparatus

A substrate processing apparatus 20 according to the embodiments of the present disclosure is a substrate processing apparatus including a vertical reaction furnace.
(Process Chamber)

Figure 1:
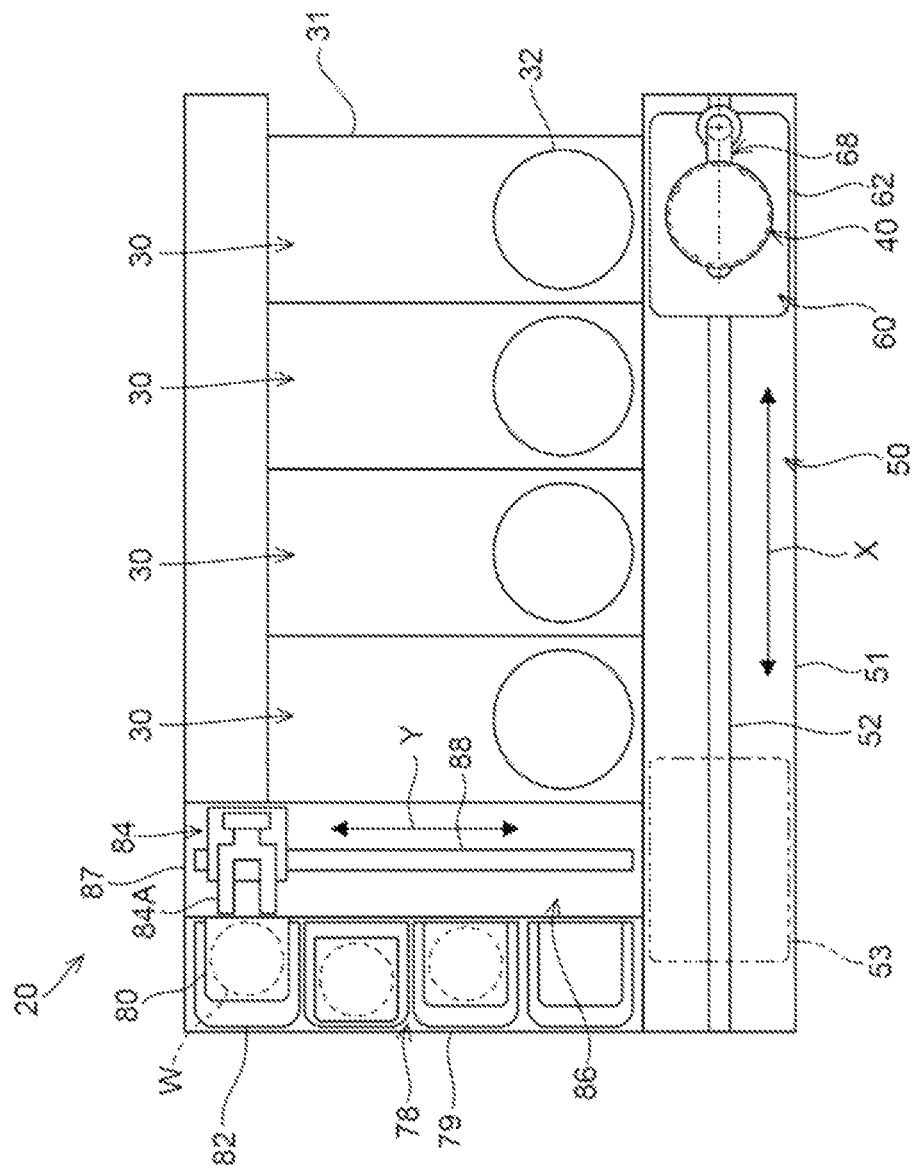
FIG. 1 is a plane view showing a schematic configuration of a substrate processing apparatus according to embodiments of the present disclosure.
Figure 2:
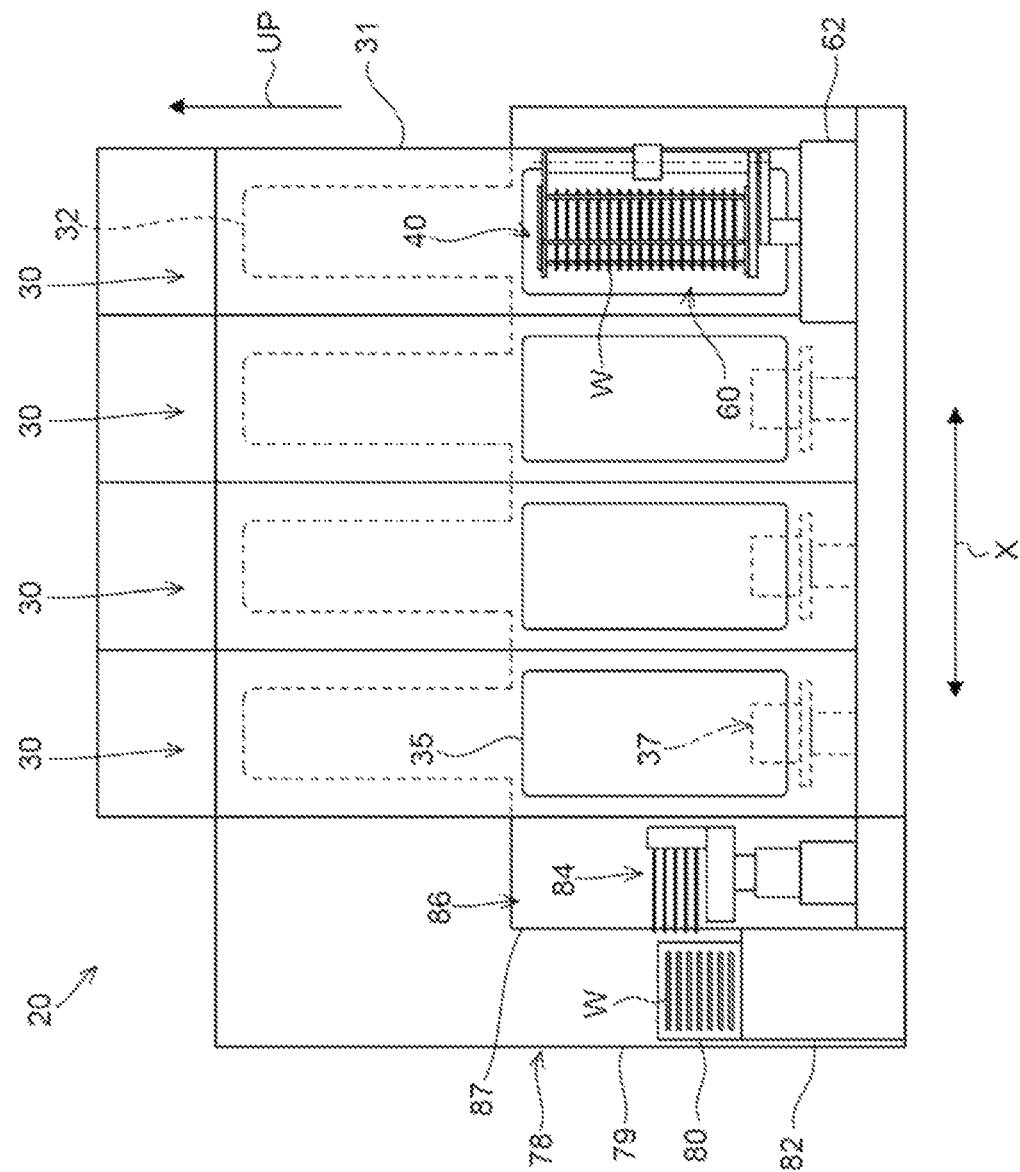
FIG. 2 is a side view showing the schematic configuration of the substrate processing apparatus of FIG. 1.
Figure 3:
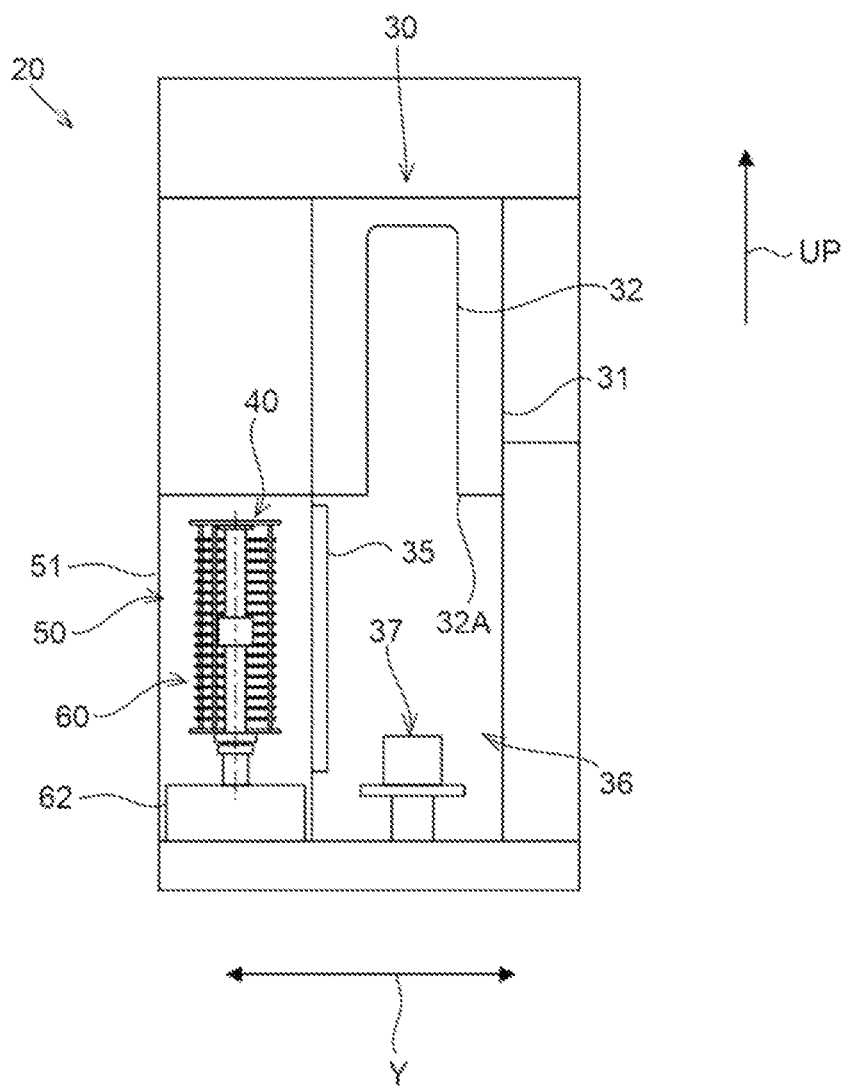
FIG. 3 is a front view showing the schematic configuration of the substrate processing apparatus of FIG. 2, showing a state in which a mounting stage is held by a conveyor.

The substrate processing apparatus 20 includes at least one process chamber 30, as shown in FIGS. 1 to 3. In the embodiments of the present disclosure, as an example, the substrate processing apparatus 20 includes four process chambers 30, but the present disclosure is not limited thereto.

The four process chambers 30 are horizontally arranged in a line as shown in FIG. 1. In the embodiments of the present disclosure, one housing 31 is partitioned to form the four process chambers 30, but the present disclosure is not limited thereto. For example, housings forming the process chambers 30 may be arranged in a line.

In addition, the four process chambers 30 may independently process substrates W. That is, the four process chambers 30 are independently controlled by a controller 100, which will be described later.

The substrate W mentioned herein includes a product substrate, a dummy substrate, a monitor substrate, and the like. In other words, the substrate W to be mounted on a mounting stage 40, which will be described later, may be a product substrate, a dummy substrate, or a monitor substrate, and may be a mixture of them.

Figure 21:
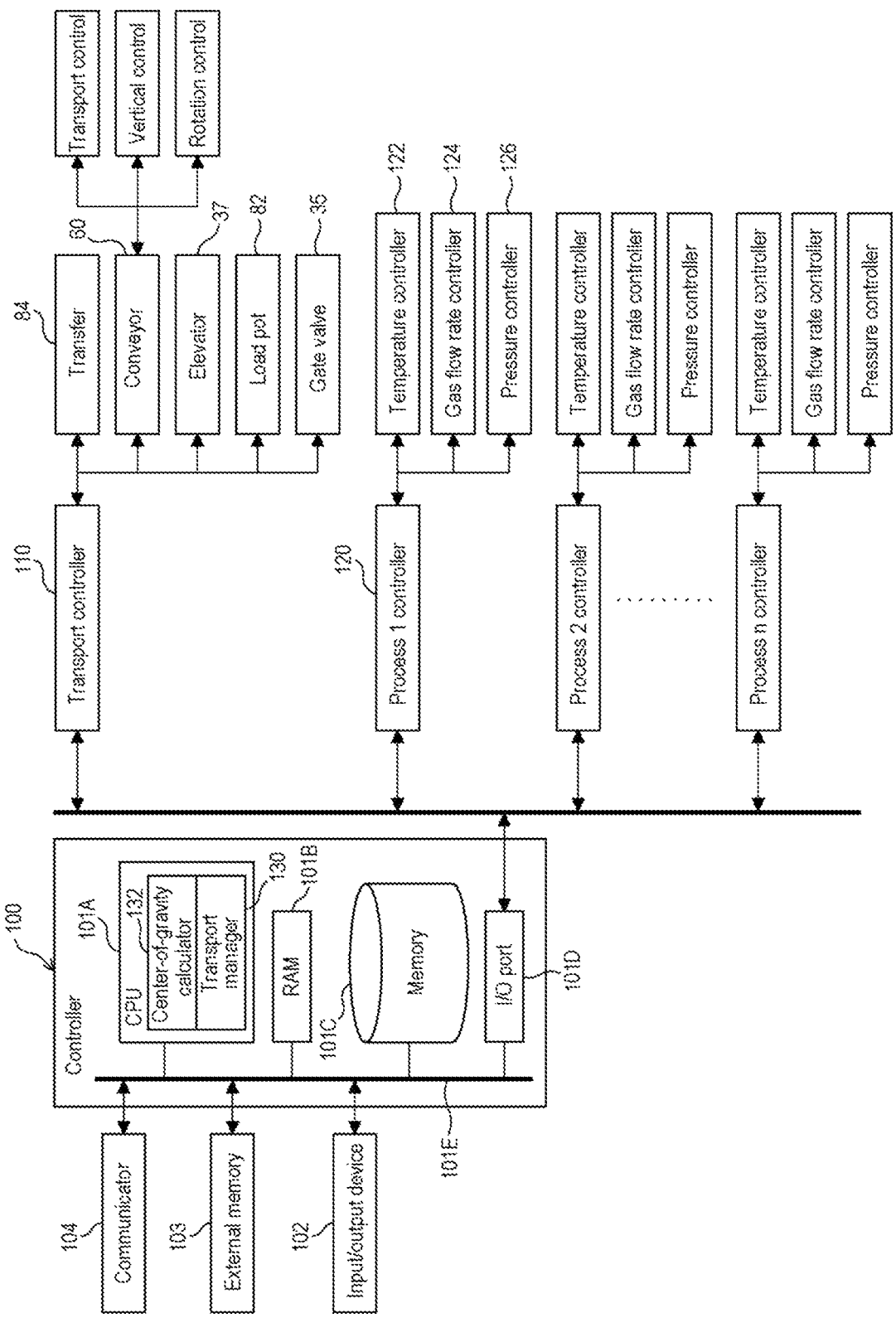
FIG. 21 is a diagram showing a configuration of a controller of the substrate processing apparatus according to embodiments of the present disclosure.

Each process chamber 30 includes a reaction furnace (process container) 32, as shown in FIGS. 2 and 3. This reaction furnace 32 is positioned in the upper side of the process chamber 30. The substrate W is loaded inside the reaction furnace 32. Specifically, the mounting stage 40 on which the substrate W is mounted is inserted inside the reaction furnace 32. A gas supply system (not shown) configured to be capable of supplying a process gas, an inert gas, and the like into the reaction furnace 32 is connected to the reaction furnace 32. A predetermined amount of gas is supplied into the reaction furnace 32 by this gas supply system. Further, an exhaust system (not shown) configured to be capable of exhausting a process gas, an inert gas, and the like from the reaction furnace 32 is connected to the reaction furnace 32. The internal pressure of the reaction furnace 32 is regulated by this exhaust system. Further, a heater (not shown) configured to heat the reaction furnace 32 is disposed on the outer periphery of the reaction furnace 32. The internal temperature of the reaction furnace 32 is regulated by this heater. In the embodiments, the gas supply system, the exhaust system, and the heater installed in the process chamber 30 are controlled by a temperature controller 122, a gas flow rate controller 124, and a pressure controller 126, respectively, as shown in FIG. 21. The temperature controller 122, the gas flow rate controller 124, and the pressure controller 126 are controlled by a controller 100, which will be described later.

The substrate W loaded into the reaction furnace 32 is heated by the heater in the reaction furnace 32 and is processed with the process gas supplied from the gas supply system. As a result, the substrate W is subjected to a film-forming process.

Further, the process chamber 30 includes a transfer chamber 36, as shown in FIG. 3. The transfer chamber 36 is positioned in the lower side of the process chamber 30. In other words, the transfer chamber 36 is positioned below the reaction furnace 32. The transfer chamber 36 is in fluid communication with the interior of the reaction furnace 32 via a furnace opening 32A of the reaction furnace 32. The transfer chamber 36 is provided with an elevator 37 to which the mounting stage 40 is transferred. The elevator 37 moves the mounting stage 40, which is transferred to an elevating stage 37A, upward together with the elevating stage 37A and inserts the mounting stage 40 into the reaction furnace 32. The peripheral portion of the elevating stage 37A separates the interior of the reaction furnace 32 and the interior of the transfer chamber 36 from each other in contact with the peripheral portion of the furnace opening 32A of the reaction furnace 32 via a seal (not shown). Further, the elevator 37 performs a function of rotating the elevating stage 37A in the horizontal direction with the vertical direction as an axis.

The process chamber 30 includes an entrance (not shown) configured to be capable of taking the substrate W in and out. This entrance is opened and closed by a gate valve 35. The size of the entrance in the embodiments of the present disclosure is set so that the mounting stage 40 may be taken in and out.
(Mounting stage)

Figure 17:
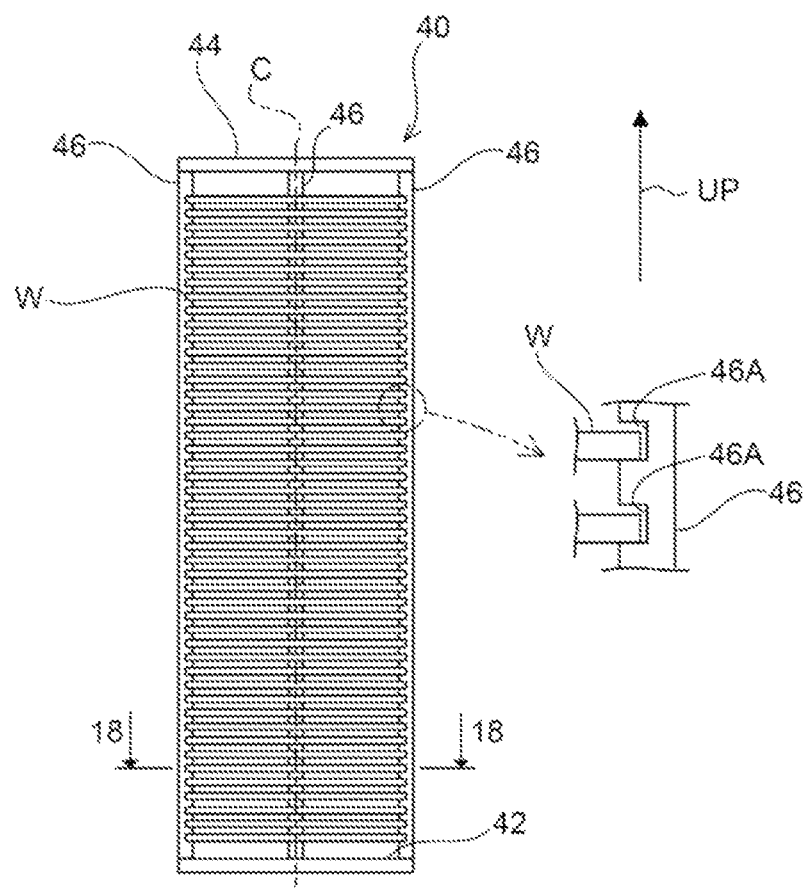
FIG. 17 is a front view of the mounting stage.
Figure 18:
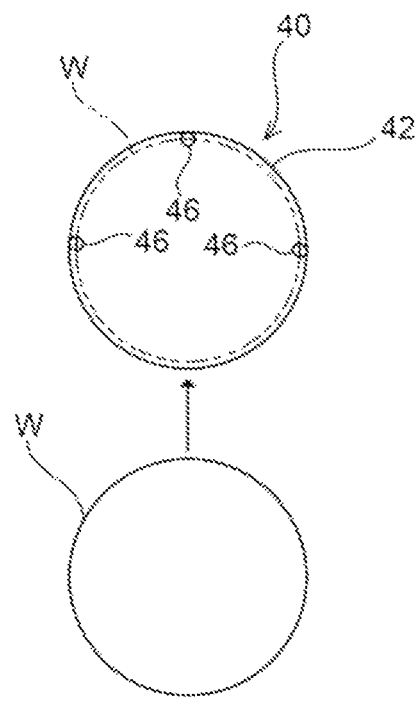
FIG. 18 is a cross-sectional view along line 18-18 in FIG. 17.

The substrate processing apparatus 20 includes the mounting stage 40 on which at least one substrate W may be mounted, as shown in FIGS. 17 and 18. The mounting stage 40 includes a bottom plate 42, a ceiling plate 44 arranged to face the bottom plate 42, and a pillar 46 supporting the bottom plate 42 and the ceiling plate 44 in a separated state. As an example, the bottom plate 42 and the ceiling plate 44 are disc-shaped, but are not limited thereto. In the embodiments of the present disclosure, three pillars 46 are provided along the peripheral portion of each of the bottom plate 42 and the ceiling plate 44 at intervals in the circumferential direction, but the present disclosure is not limited thereto. In addition, although the pillars 46 are formed in a columnar shape as an example, the present disclosure is not limited thereto. Groove portions 46A are formed in the pillars 46 at intervals in the longitudinal direction. The peripheral portion of the substrate W is inserted into the groove portions 46A. The inserted substrate W is supported by groove walls below the groove portions 46A. Then, by inserting the substrate W into the groove portions 46A of the three pillars 46 at the same height, it is possible to horizontally support the substrate W. Further, the groove width of each groove portion 46A is larger than the thickness of the substrate W. This can prevent the surface of the substrate W from coming into contact with the groove wall of the groove portion 46A when the substrate W is taken into and out of the mounting stage 40. In addition, the three pillars 46 are formed at a wider arrangement interval in one place for the taking-in and taking-out of the substrate W. Specifically, the three pillars 46 are arranged at an angle of 45 degrees with respect to a center C of the mounting stage 40. In addition, since the pillars 46 include the groove portions 46A in which the substrate W is mounted, it can also be called a substrate mounting tool.
(Transport Chamber)

The substrate processing apparatus 20 includes a transport chamber 50 including a conveyor 60, as shown in FIGS. 1 and 3. The transport chamber 50 extends in a direction in which the four process chambers 30 are arranged. The transport chamber 50 is in fluid communication with each process chamber 30 via the entrance of each process chamber 30. Housings 51 that constitute the transport chamber 50 are fixed to the respective housings 31. Further, an exhauster or the like configured to be capable of forming a vacuum atmosphere in the transport chamber 50 is connected to the transport chamber 50.

A rail 52 extending in a direction in which the four process chambers 30 are arranged is installed at the bottom surface of the transport chamber 50. The conveyor 60 moves along this rail 52. The conveyor 60 transfers the mounting stage 40 on which the substrate W is mounted, along the rail 52. Hereinafter, a direction in which the conveyor 60 moves, that is, a direction in which the mounting stage 40 on which the substrate W is mounted is transferred, is referred to as a substrate transfer direction as appropriate. The substrate transfer direction is a direction indicated by an arrow X in FIGS. 1 and 3. A direction indicated by an arrow UP in FIGS. 2 and 3 represents an upward vertical direction.

The conveyor 60 is configured to be capable of moving along the rail 52 inside the transport chamber 50. The conveyor 60 is controlled by the controller 100 to move toward the target process chamber 30.

Figure 7:
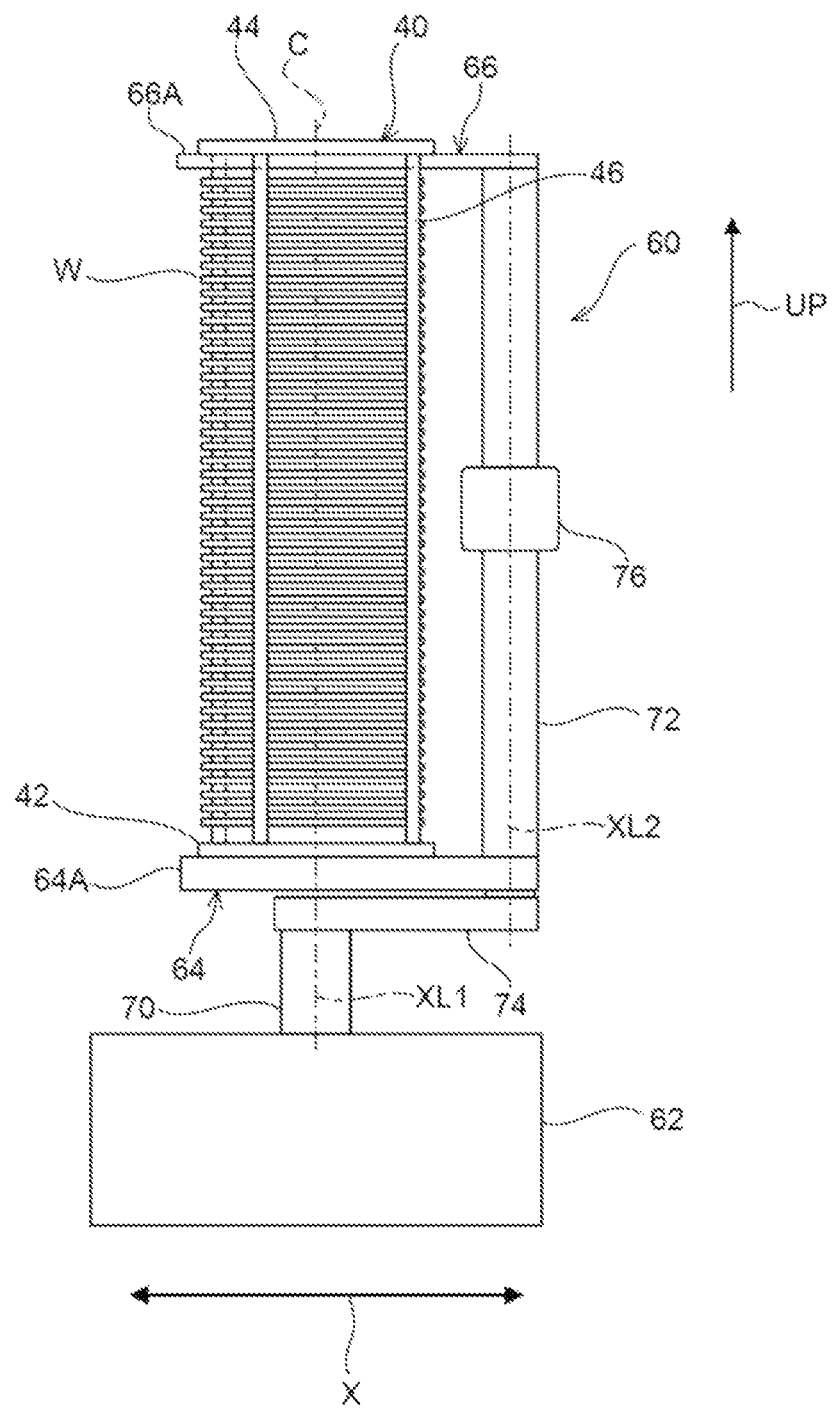
FIG. 7 is a side view showing a state in which the mounting stage is being transported by the conveyor of FIG. 2.

As shown in FIG. 7, the conveyor 60 is an apparatus capable of transferring the mounting stage 40 while holding the mounting stage 40 at least two places in the vertical direction. The conveyor 60 includes a transport stage 62, a lower holder 64, an upper holder 66, and a mover 68.

The transport stage 62 is a pedestal portion that moves on the rail 52. A driver (not shown) configured to be capable of moving the transport stage 62 along the rail 52 in the transfer direction is installed inside the transport stage 62.

The lower holder 64 is a portion that holds the lower side of the mounting stage 40. As an example, the lower holder 64 in the embodiments of the present disclosure supports the bottom plate 42, as shown in FIG. 7. Further, in the embodiments, the lower holder 64 is plate-shaped, but is not limited thereto.

The upper holder 66 holds the upper side of the mounting stage 40. As an example, the upper holder 66 in the embodiments of the present disclosure supports the ceiling plate 44, as shown in FIG. 7. The upper holder 66 is inserted between the uppermost substrate W and the ceiling plate 44, as shown in FIG. 7. Further, in the embodiments of the present disclosure, the upper holder 66 is plate-shaped, but is not limited thereto.

The lower holder 64 and the upper holder 66 face each other and are connected by a rotary shaft 72, which will be described later. The rotary shaft 72 connects one end portion 64A of the lower holder 64 and one end portion 66A of the upper holder 66.

Further, in the embodiments of the present disclosure, the lower holder 64 and the upper holder 66 hold the mounting stage 40 so that they scoop up (lift) the ceiling plate 44 and the bottom plate 42 of the mounting stage 40.

In the transfer state of the mounting stage 40 by the conveyor 60, the bottom plate 42 of the mounting stage 40 is supported by the lower holder 64, and the ceiling plate 44 of the mounting stage 40 is supported by the upper holder 66. That is, the mounting stage 40 is held by the lower holder 64 and the upper holder 66.

Figure 8:
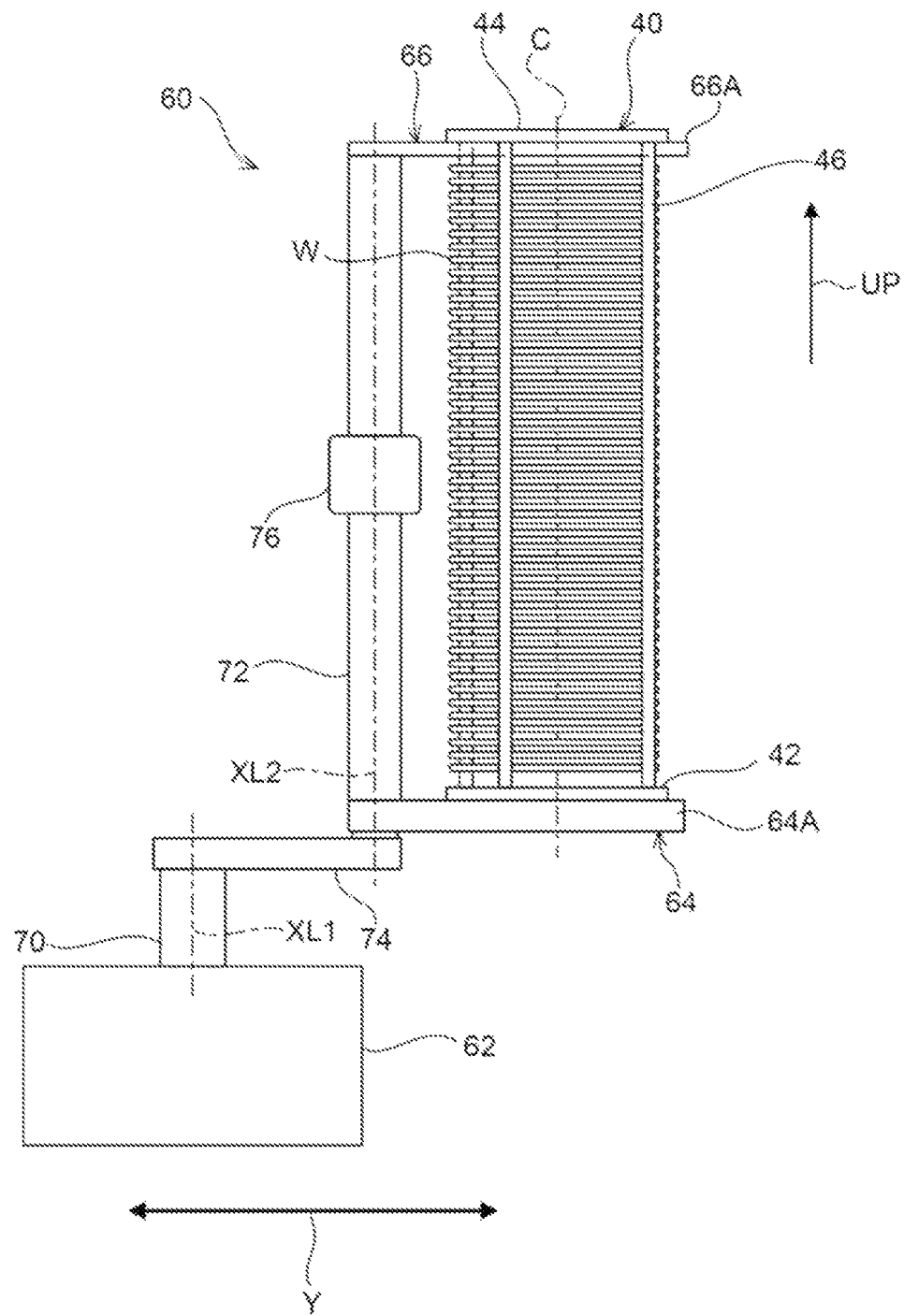
FIG. 8 is a front view showing an operation of extending a mover of the conveyor of FIG. 7 to load the mounting stage into the process chamber.
Figure 12:
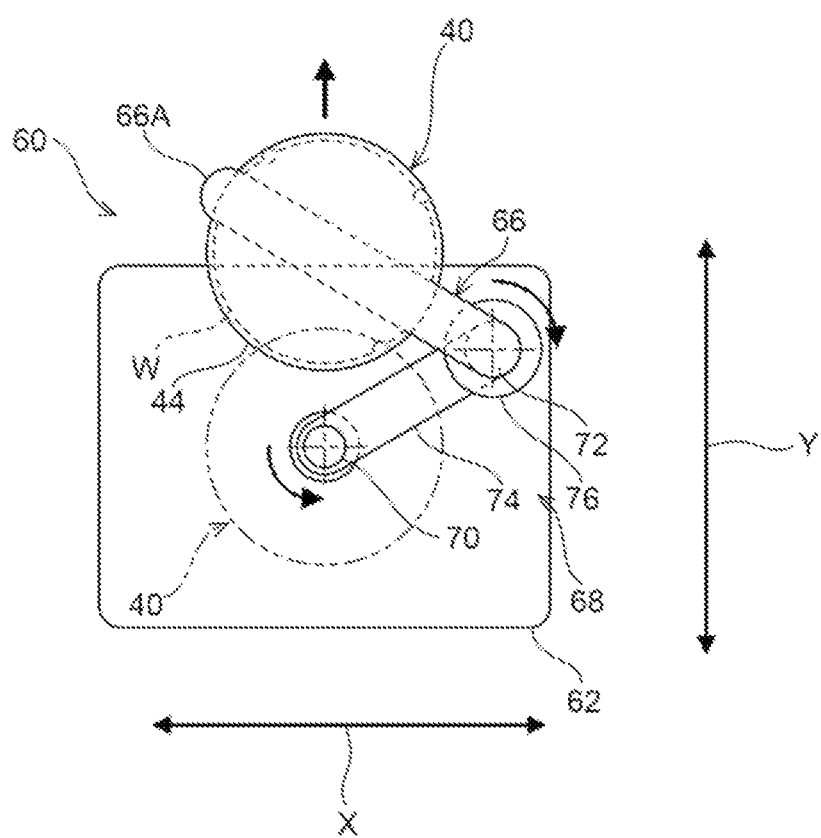
FIG. 12 is a plane view of the conveyor of FIG. 11, showing a state in which the mover is gradually extended toward a target process chamber.

The mover 68 is provided at the transport stage 62 and may extend and contract in the horizontal direction and the vertical direction with respect to the transport stage 62 (see FIGS. 8 and 12). The mover 68 includes a rotary shaft 70 as a first rotator, a rotary shaft 72 as a second rotator, and an arm 74.

Figure 9:
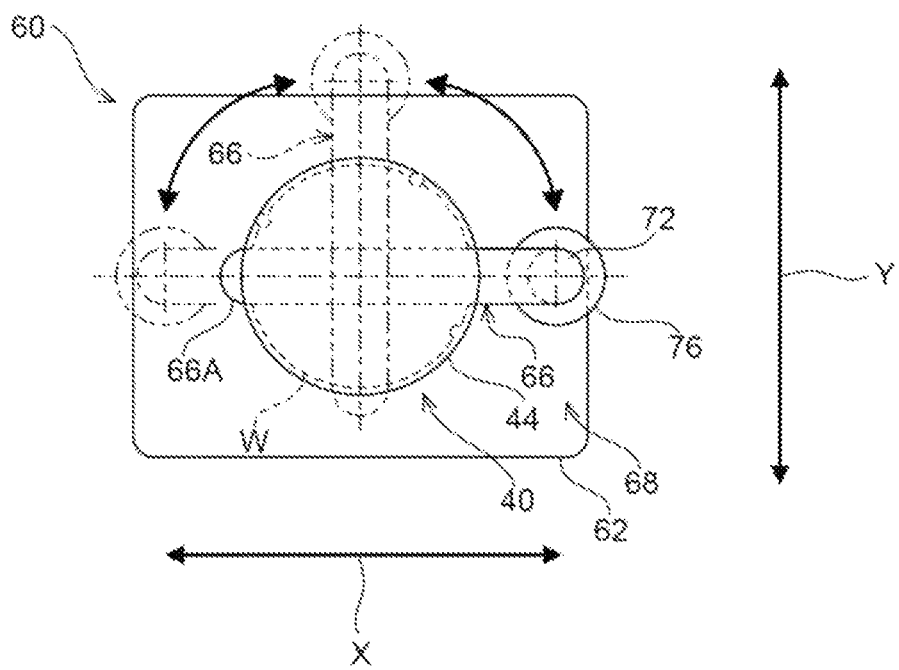
FIG. 9 is a plane view of the conveyor of FIG. 7.

As shown in FIGS. 8 and 9, the rotary shaft 70 rotates the arm 74 in the horizontal direction with the vertical direction as an axis. Specifically, the rotary shaft 70 is rotatably supported by the transport stage 62. A rotation driver (not shown) that rotates the rotary shaft 70 and an elevator (not shown) that raises or lowers the rotary shaft 70 are connected to the rotary shaft 70. The rotary shaft 70 extends upward from the transport stage 62. A lower end position of the rotary shaft 70 is rotatably supported in the transport stage 62 by, for example, a bearing. Further, a rotational force is transmitted to the lower end position of the rotary shaft 70 from the rotation driver. Further, the rotary shaft 70 is vertically moved by the elevator. An upper end position of the rotary shaft 70 is fixed to one end portion of the arm 74. In the figure, a shaft center of the rotary shaft 70 is indicated by XL1.

Figure 10:
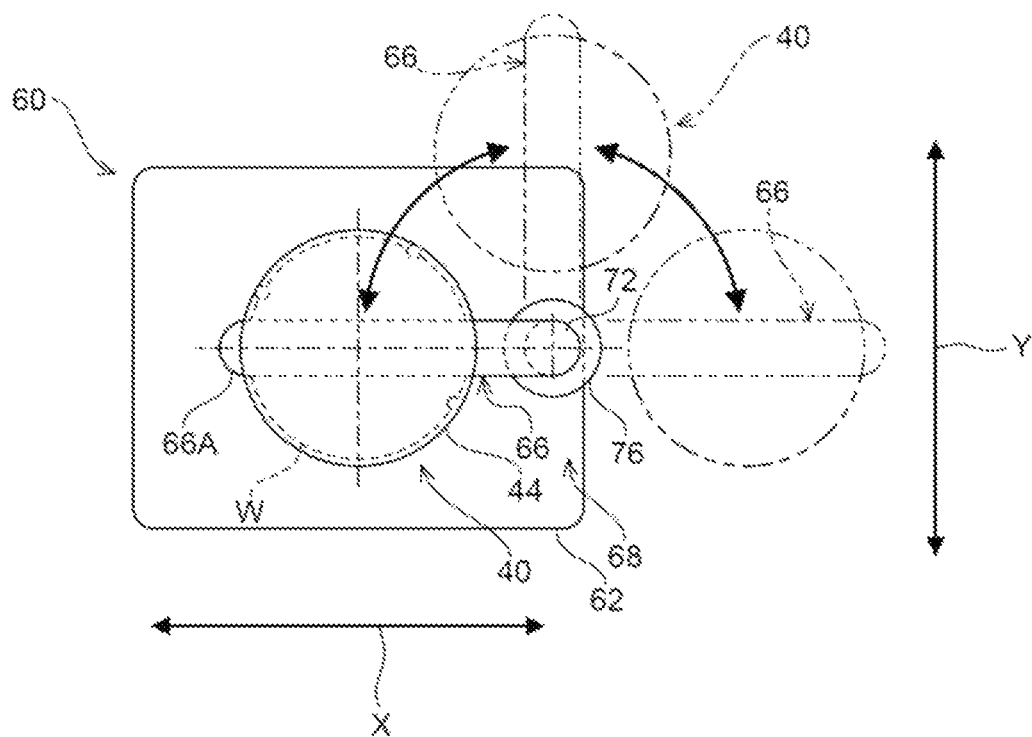
FIG. 10 is a plane view of the conveyor of FIG. 9.

As shown in FIGS. 8 and 10, the rotary shaft 72 rotates the lower holder 64 and the upper holder 66 in the horizontal direction with the vertical direction as an axis. Specifically, a rotation driver (not shown) that rotates the rotary shaft 72 with respect to the arm 74 is connected to the rotary shaft 72. A lower end position of the rotary shaft 72 is rotatably supported by the other end of the arm 74 and extends upward. The lower end position of the rotary shaft 72 is rotatably supported within the arm 74 by, for example, a bearing. Further, a rotational force is transmitted to the lower end position of the rotary shaft 72 from the rotation driver. The lower holder 64 and the upper holder 66 are arranged at the rotary shaft 72 at an interval therebetween in the axial direction. In the embodiments of the present disclosure, as an example, the other end portion of the upper holder 66 is connected to the upper end position of the rotary shaft 72. In the figure, a shaft center of the rotary shaft 70 is denoted by XL2.

Here, the operation of the mover 68 will be described. As shown in FIGS. 7 and 9, in a state where the mover 68 is contracted, the lower holder 64 and the upper holder 66 are positioned on the shaft center XL1 of the rotary shaft 70. When the mover 68 is contracted in a state where the mounting stage 40 is held by the lower holder 64 and the upper holder 66, it is possible to align the center C of the mounting stage 40 and the shaft center XL1 of the rotary shaft 70. Then, as shown in FIG. 9, the arm 74 is rotated by rotating the rotary shaft 70 with respect to the transport stage 62 in a state where the center C of the mounting stage 40 and the shaft center XL1 of the rotary shaft 70 are aligned. At this time, since the center C of the mounting stage 40 and the shaft center XL1 of the rotary shaft 70 are aligned, the rotational movement of the mounting stage 40 about the rotary shaft 70 is suppressed, such that the substrate W is prevented from being displaced by centrifugal force.

Further, as shown in FIG. 10, when the rotary shaft 72 is rotated, the mounting stage 40 rotates and moves about the rotary shaft 72 together with the lower holder 64 and the upper holder 66, such that the mover 68 is in an extended state.

Figure 13:
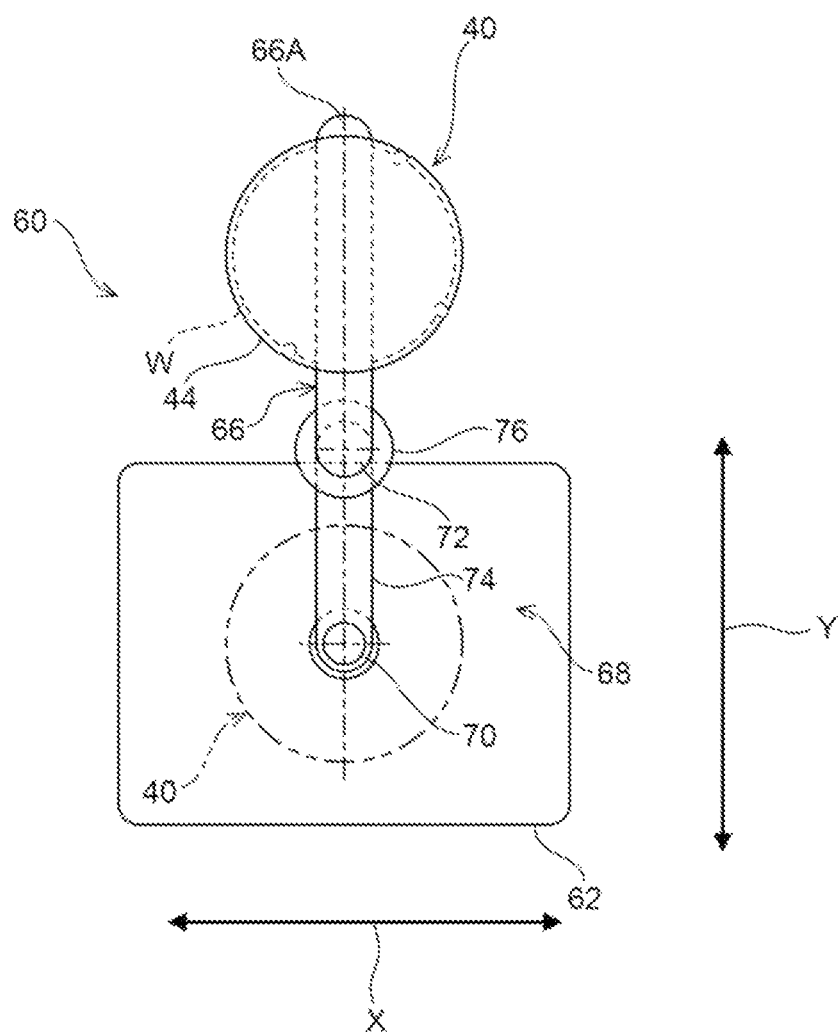
FIG. 13 is a plane view of the conveyor of FIG. 12, showing a state in which the mover is fully extended toward the target process chamber.

Then, when moving the mounting stage 40 into and out of the process chamber 30 via the entrance of the process chamber 30, the rotary shaft 70 and the rotary shaft 72 are rotated respectively, as shown in FIGS. 12 and 13. As a result, the mounting stage 40 moves linearly via the entrance of the process chamber 30. By extending and contracting the mover 68 in this way, the mounting stage 40 may be loaded into the process chamber 30 or may be unloaded from the process chamber 30.

The rotary shaft 70 and the rotary shaft 72 are respectively controlled by a transport controller 110. Specifically, the rotation driver and the elevator of the rotary shaft 70 are controlled by the transport controller 110. Further, the rotation driver of the rotary shaft 72 is controlled by the transport controller 110. In the embodiments of the present disclosure, the transport controller 110 regulates the rotary shaft 70 and the rotary shaft 72 so that the mounting stage 40 and the lower holder 64/the upper holder 66 are arranged in the same condition with respect to the traveling direction of the conveyor 60 (see FIG. 11). As an example, in the embodiments of the present disclosure, the conveyor 60 transfers the mounting stage 40 in a state where the center C of the mounting stage 40 and the shaft center XL1 of the rotary shaft 70 are aligned and the rotary shaft 72 is positioned in front of the conveyor 60 in the traveling direction. In addition, the transport controller 110 is controlled by the controller 100.

Figure 6:
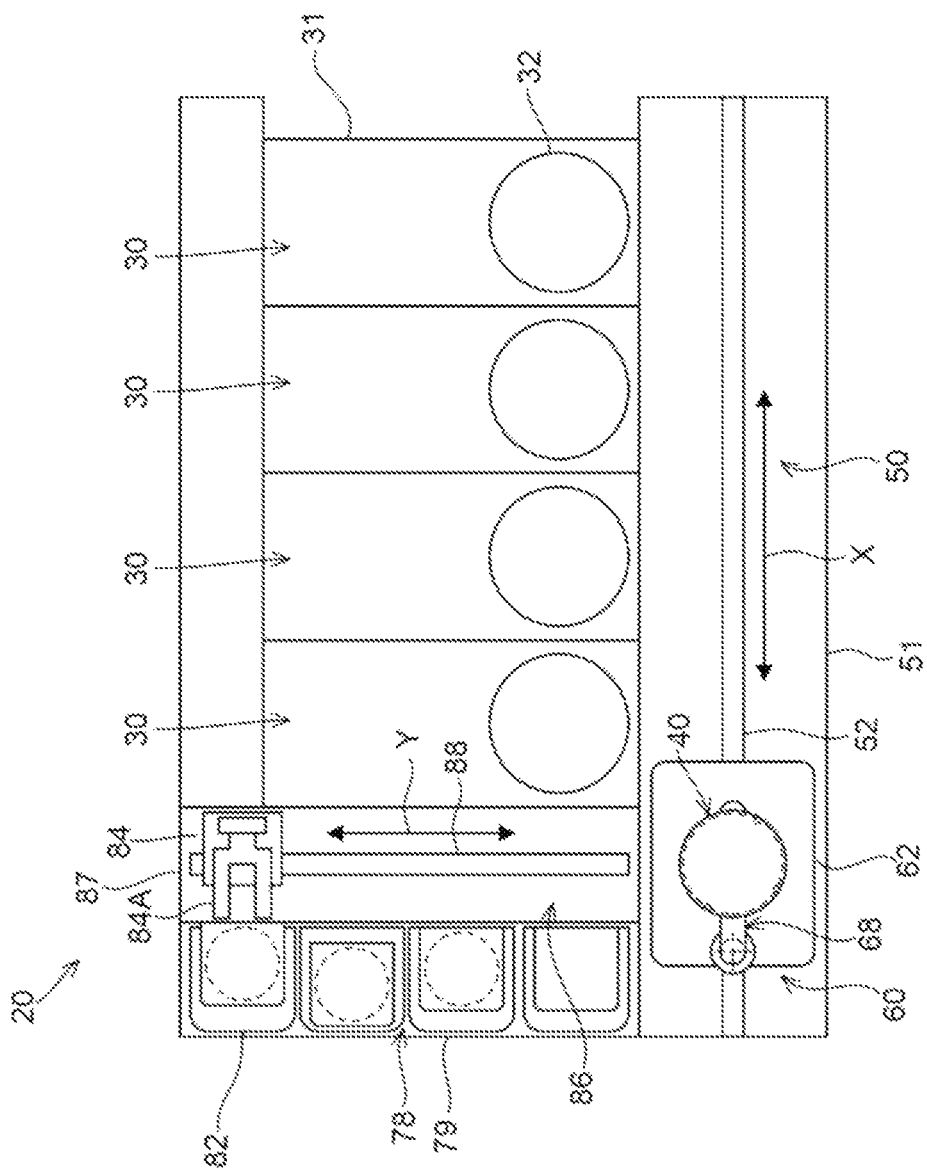
FIG. 6 is a plane view showing the schematic configuration of the substrate processing apparatus of FIG. 1, showing a state in which the conveyor is moved to a transfer area.

Further, as shown in FIG. 6, the rotary shaft 70 and the rotary shaft 72 regulate an orientation of the mounting stage 40 so that, when the conveyor 60 is in a transfer area 53 of the transport chamber 50, the substrate W may be transferred to a transfer 84 which will be described later.

Figure 19:
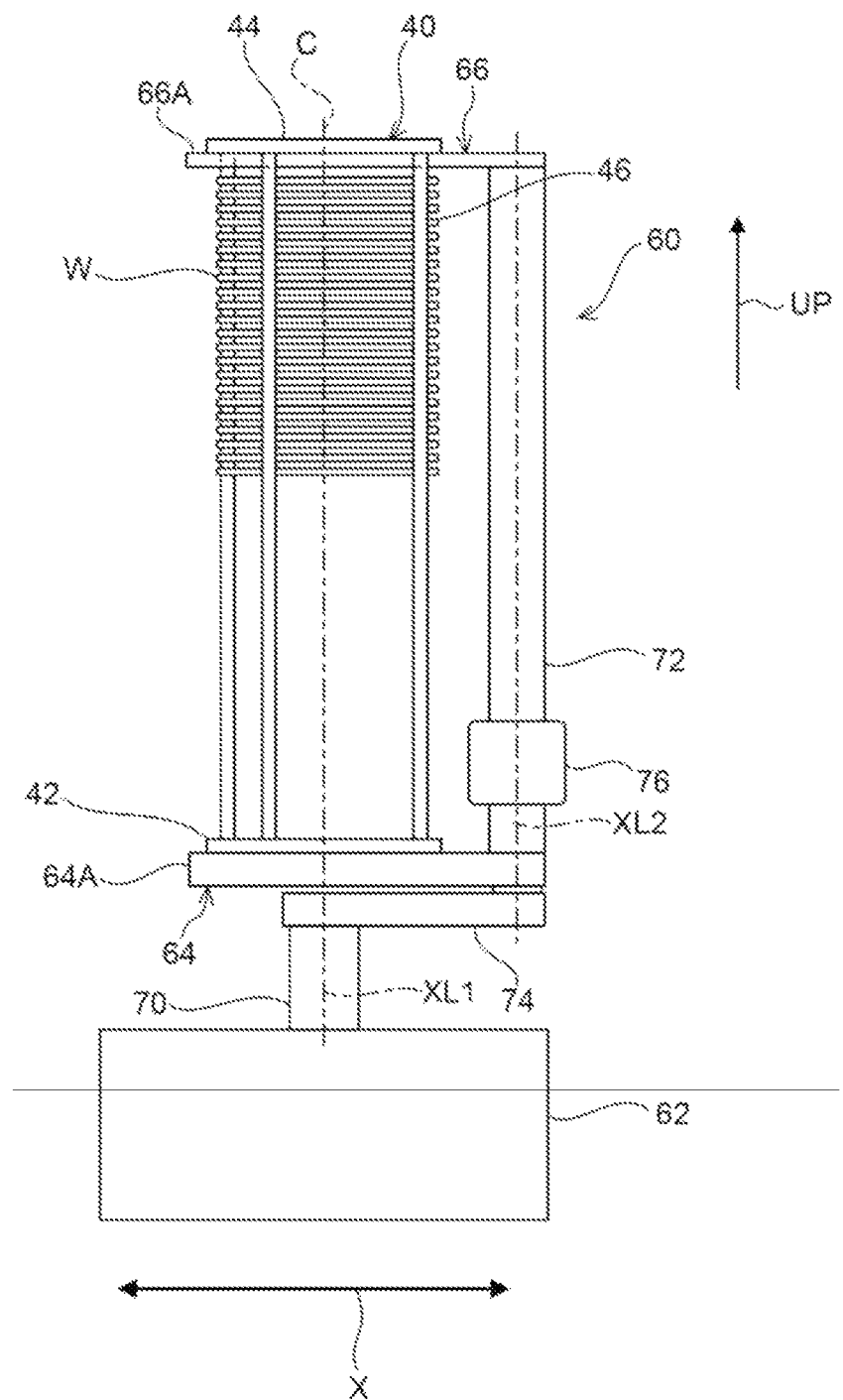
FIG. 19 is a side view of the conveyor, showing a position of a balancer when holding the mounting stage on which the substrate is placed in the upper side.
Figure 20:
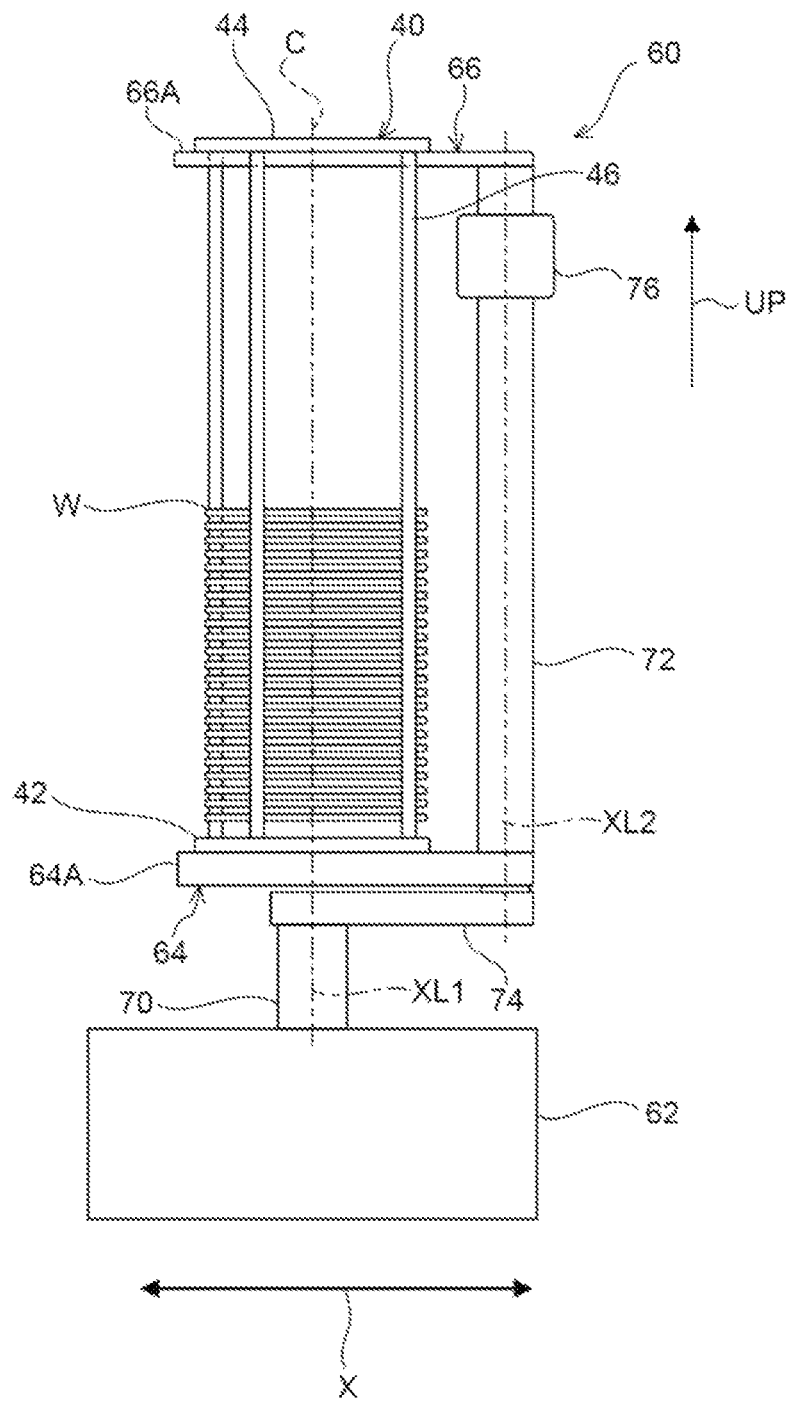
FIG. 20 is a side view of the conveyor, showing the position of the balancer when holding the mounting stage on which the substrate is place in the lower side.

Further, the conveyor 60 is configured to be capable of regulating a center-of-gravity position of the mounting stage 40. In the embodiments of the present disclosure, as an example, a balancer 76 as a weight is attached to the rotary shaft 72, as shown in FIG. 7. The balancer 76 is formed in, for example, an annular shape and is externally mounted on the rotary shaft 72. Further, the balancer 76 is configured to be capable of moving along the rotary shaft 72. The balancer 76 moves on the rotary shaft 72 by a movable machinery such as a belt and a pulley, a ball screw and a slider, or the like. As the balancer 76 moves along the rotary shaft 72, the center-of-gravity position of the mounting stage 40 is regulated. Specifically, when the substrates W are evenly arranged on the upper side and lower side of the mounting stage 40, the balancer 76 may be positioned at the center of the rotary shaft 72, as shown in FIG. 7. On the other hand, when the substrates W are arranged in the upper side of the mounting stage 40 than the lower side thereof, the balancer 76 may be positioned at the lower side of the rotary shaft 72, as shown in FIG. 19. Further, when more substrates W are arranged in the lower side of the mounting stage 40 than the upper side thereof, the balancer 76 may be positioned at the upper side of the rotary shaft 72, as shown in FIG. 20.

The substrate processing apparatus 20 includes a load port 82 on which an accommodating container 80 may be mounted, and a transfer 84, as shown in FIGS. 1 and 2.

The accommodating container 80 is a container capable of accommodating at least one substrate W. As an example, the accommodating container 80 may be a front opening unified pod (FOUP), but is not limited thereto. Further, as the substrate W, a product substrate, a dummy substrate, a monitor substrate, and the like are accommodated in each accommodating container 80.

The load port 82 is a pedestal on which the accommodating container 80 may be placed. As an example, in the embodiments of the present disclosure, four load ports 82 are arranged in a row in a direction perpendicular to the substrate transfer direction in a plane view of the substrate processing apparatus 20, but is not limited thereto. The number of load ports 82 may be more than four, or may be three or less.

Further, in the embodiments of the present disclosure, the accommodating container 80 and the load port 82 are arranged inside an accommodating chamber 78. The accommodating chamber 78 is formed by a housing 79.

The transfer 84 may transfer at least one substrate W and transfer the substrate W between the accommodating container 80 mounted on the load port 82 and the transport chamber 50. Specifically, the transfer 84 performs a function of taking out the substrate W from the accommodating container 80 mounted on the load port 82 and transferring the substrate W to the mounting stage 40 and a function of taking out the substrate W from the mounting stage 40 and transferring the substrate W to the accommodating container 80.

The transfer 84 includes a transfer chamber 86 extending in a direction orthogonal to the substrate transfer direction in the plane view of the substrate processing apparatus 20. The direction orthogonal to the substrate transfer direction is appropriately referred to as a substrate transfer direction. In FIG. 1, the substrate transfer direction is indicated by an arrow Y.

The transfer chamber 86 is located between the accommodating chamber 78 and the process chamber 30. One side surface of a housing 87 constituting the transfer chamber 86 is connected to the housing 31 of the process chamber 30. The other side surface of the housing 87 is provided with the entrances (not shown) for the substrates W at positions corresponding to the four load ports 82, respectively. These entrances are closed by shutters (not shown). Further, a vacuum apparatus is connected to the transfer chamber 86 so that a state of vacuum may be adjusted.

A rail 88 extending in the substrate transfer direction is installed at the bottom surface of the transfer chamber 86. The transfer 84 moves on the rail 88.

The transfer 84 includes a holder 84A that holds the substrate W. Further, the transfer 84 includes a movable machinery (not shown) that moves the holder 84A along the rail 88, and a rotator (not shown) that changes the orientation of the holder 84A. Examples of the movable machinery may include a machinery including a belt and a pulley, a machinery including a ball screw and a slider, and the like.

The operation of the transfer 84 of taking out the substrate W from the accommodating container 80 mounted on the load port 82 and transferring the substrate W to the mounting stage 40 and the operation thereof of taking out the substrate W from the mounting stage 40 and transferring the substrate W to the accommodating container 80 are controlled by the transport controller 110. Further, the transfer 84 is controlled by the controller 100 as to which one of the substrates W accommodated in the four accommodating containers 80 should be taken out.

(Controller)

The substrate processing apparatus 20 includes the controller 100, as shown in FIG. 21. The controller 100 is configured as a computer including a CPU (Central Processing Unit) 101A, a RAM (Random Access Memory) 101B, a memory 101C, and an I/O port 101D.

The RAM 101B, the memory 101C, and the I/O port 101D are configured to be capable of exchanging data with the CPU 101A via an internal bus 101E. An input/output device 102 configured as, for example, a touch panel or the like is connected to the controller 100. Further, for example, a communicator 104 configured to be capable of communicating with a host apparatus is connected to the controller 100.

The memory 101C is configured by, for example, a flash memory, a HDD (Hard Disk Drive), or the like. A control program that controls operations of the substrate processing apparatus, a process recipe in which sequences and conditions of substrate processing to be described later are written, etc. are readably stored in the memory 101C. The process recipe functions as a program that causes the controller 100 to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 101B is configured as a memory area (work area) in which programs or data read by the CPU 101A are temporarily stored.

The I/O port 101D is connected to the transport controller 110, a plurality of process controllers 120, and the like. The transport controller 110 is a controller that controls transfer of the substrate W. Each process controller 120 is a controller that controls a film-forming process of the substrate W. In the embodiments of the present disclosure, since the four process chambers 30 are provided, four process controllers 120 are provided corresponding to the respective process chambers 30. As a result, it is possible to perform the film-forming process independently for each process chamber 30.

The CPU 101A is configured to be capable of reading and executing the control program from the memory 101C. The CPU 101A is also configured to be capable of reading the recipe from the memory 101C according to an input of a manipulation command from the input/output device 102. The CPU 101A is configured to be capable of causing the transport controller 110 to control the transfer operation of the substrate W by the transfer 84, the elevator 37, and the conveyor 60, the opening/closing operation of the gate valve 35 and the shutter, the positioning operation of the load port 82, and so on, according to contents of the read recipe.

Further, the CPU 101A is configured to be capable of causing the process controller 120 to control the temperature controller 122, the gas flow rate controller 124, and the pressure controller 126 according to contents of the read recipe. The temperature controller 122 is configured to be capable of controlling the temperature adjustment operation of the heater that heats the interior of the reaction furnace 32. The gas flow rate controller 124 is configured to be capable of controlling the flow rate adjustment operation of a gas supplied into the reaction furnace 32. The pressure controller 126 is configured to be capable of controlling the pressure adjustment operation within the reaction furnace 32.

The controller 100 may be configured by installing, on the computer, the aforementioned program stored in an external memory (for example, a magnetic disc such as a hard disc, an optical disc such as a CD, a magneto-optical disc such as a MO, or a semiconductor memory such as an USB memory) 103. The memory 101C or the external memory 103 is configured as a computer-readable recording medium. Hereinafter, the memory 101C and the external memory 103 may be generally and simply referred to as a "recording medium." When the term "recording medium" is used herein, it may indicate a case of including the memory 101C, a case of including the external memory 103, or a case of including both the memory 101C and the external memory 103. Furthermore, the program may be provided to the computer by using the Internet, a dedicated line, or the like, instead of using the external memory 103.

Further, the controller 100 confirms the holding state of the mounting stage 40 by the conveyor 60 when the substrate W is transferred. The holding state of the mounting stage 40 by the conveyor 60 may be confirmed by, for example, detecting presence or absence of the mounting stage 40 by using an optical sensor, detecting the presence or absence of the mounting stage 40 based on a mass of the mounting stage 40 by using a load cell, or detecting the presence or absence of the mounting stage 40 by analyzing image information acquired by a photographing apparatus such as a camera, but the present disclosure is not limited thereto. The controller 100 performs control to move the conveyor 60 to the transfer area 53 when the conveyor 60 holds the mounting stage 40. On the other hand, when the conveyor 60 does not hold the mounting stage 40, the controller 100 acquires the mounting stage 40 from the target process chamber 30 and holds the same, and then performs control to move the conveyor 60 to the transfer area 53. The target process chamber mentioned herein includes a process chamber into which an unprocessed substrate W is to be transferred and loaded (hereinafter, appropriately referred to as a "process chamber for loading"), and a process chamber from which a processed substrate W is to be acquired when or immediately before the film-forming process of the substrate W is completed (hereinafter, appropriately referred to as a "process chamber for acquisition").

The controller 100 may control the transfer of the conveyor 60 between the transfer area 53 and the process chamber 30 and may control the transfer of the conveyor 60 between a process chamber 30 in which the substrate W is processed and another process chamber 30. That is, the controller 100 may transfer the substrate W between the transfer area 53 and the process chamber 30 by the conveyor 60. The controller 100 may then control the conveyor 60 to transfer the substrate W processed in the process chamber 30 to another process chamber 30. As a result, it is possible to process the substrate W via a plurality of process chambers 30.

The memory 101C stores distance information between the transfer area 53 and each process chamber 30. The controller 100 is configured to be capable of acquiring the distance information of the target process chamber 30 from the memory 101C and control a moving distance of the conveyor 60 based on the acquired distance information. Further, when the mounting stage 40 is transported from the process chamber 30 in which the substrate W was already processed to another process chamber 30 by the conveyor 60, the distance information between the transfer area 53 and the process chamber 30 and the distance information between the transfer area 53 and another process chamber are acquired from the memory 101C, and from a difference therebetween, distance information between the process chambers 30 is calculated. Then, the controller 100 performs the transport control of the conveyor 60 based on the calculated distance information. Further, the distance information may be acquired from the communicator 104 or the external memory 103, or may be input from the input/output device 102.

Further, the controller 100 includes a transport manager 130 that controls the conveyor 60. The transport manager 130 is configured to be capable of receiving instructions from the controller 100 and controlling the conveyor 60. Specifically, the controller 100 is configured to capable of giving an instruction regarding the transport of the conveyor 60 to the transport manager 130 and the transport manager 130 is configured to be capable of performing the transport control of the conveyor 60 according to the instruction from the controller 100.

The controller 100 includes a center-of-gravity calculator 132 capable of regulating and managing the center-of-gravity position of the mounting stage 40 in the vertical direction. The center-of-gravity calculator 132 is configured to be capable of calculating the center-of-gravity position of the mounting stage 40 according to the mounting state of the substrate W mounted on the mounting stage 40. Specifically, the controller 100 instructs the transport manager 130 to move the balancer 76 in the vertical direction according to the center-of-gravity position calculated by the center-of-gravity calculator 132 to regulate the center-of-gravity position of the mounting stage 40. The center-of-gravity position of the mounting stage 40 is calculated by the following formula.

$$xG = (m1x1 + m2x2 + \ldots)/(m1 + m2 + \ldots)$$

xG indicates the center-of-gravity position of the mounting stage 40.

m1, m2, . . . indicate the weights of the substrates W.

x1, x2, . . . indicate the mounting positions of the substrates W.

Here, an example in which effective number of mounting of the substrates W is 50 will be described.

In a case where the weight (m) of the substrate is 130 g and the substrate mounting position is set to 1 at the bottom of the mounting stage and 50 at the top of the mounting stage, when 50 substrates are mounted on the mounting stage, the center-of-gravity position is the twenty-sixth substrate mounting position. Further, when 25 substrates are mounted on the lower side of the mounting stage, a center of gravity may be obtained as the thirty-eighth mounting position, and when 25 substrates are mounted on the upper side of the mounting stage, the center of gravity may be obtained as a thirteenth mounting position.

Figure 22:
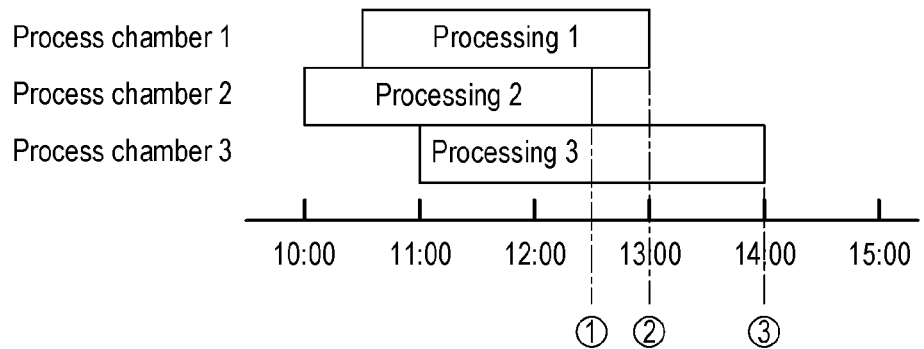
FIG. 22 shows a normal transport schedule of the substrate processing apparatus.
Figure 23:
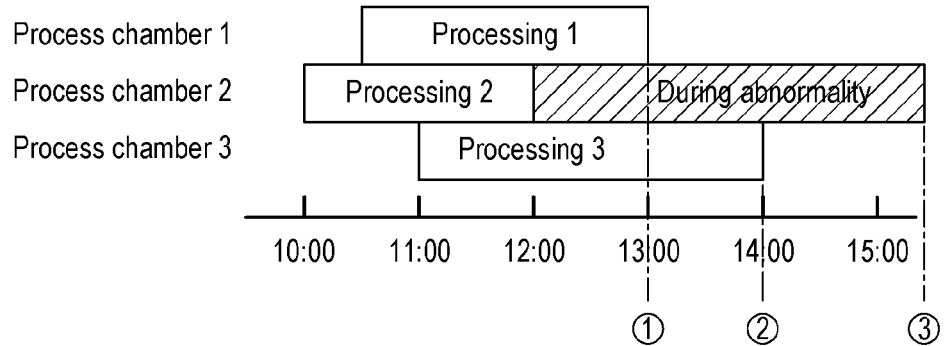
FIG. 23 shows a transport schedule when the substrate processing apparatus is abnormal.

Further, the controller 100 monitors the state of the process chamber 30 and regulates a transport schedule of the conveyor 60 according to the state of the process chamber 30. Specifically, the controller 100 monitors a processing state of the substrate W in each process chamber 30 and regulates a transport schedule of the next substrate W in such an order that a substrate W for which completion of the processing is closest is the next to be transported. As an example, in an event where an abnormality occurs in one of four process chambers 30 while the substrates W are being processed in the four process chambers 30, when the processing in the subsequent process chamber 30 is completed before the process chamber 30 in which the abnormality occurred is recovered, the controller 100 gives a priority to the transport of the mounting stage 40 of the subsequent process chamber 30. On the other hand, a substrate processing schedule is regulated such that the mounting stage 40 of the process chamber 30 in which the abnormality occurred is not unloaded, and the priority is lowered for the transport of the mounting stage 40 of the process chamber 30 in which the abnormality occurred until its recovery is achieved (see FIGS. 22 and 23).

Method of Manufacturing Semiconductor Device

Next, a method of manufacturing a semiconductor device by using the substrate processing apparatus 20 according to embodiments of the present disclosure, that is, a procedure of processing the substrate W, will be described. In the following description, an operation of each component constituting the substrate processing apparatus 20 is controlled by the controller 100.

First, as shown in FIG. 6, the conveyor 60 is moved to the transfer area 53 of the transport chamber 50. Next, the mover 68 of the conveyor 60 is rotated to orient the mounting stage 40 so that the transfer 84 may mount the substrate W thereon. The transfer 84 transfers the target substrate W from the accommodating container 80 to the mounting stage 40.

Figure 11:
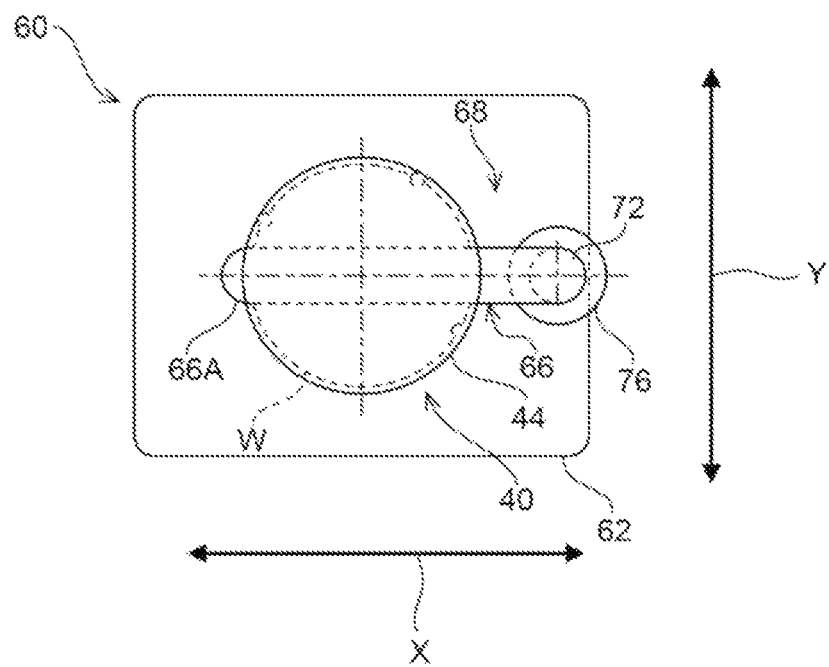
FIG. 11 is a plane view of the conveyor arriving at a target process chamber.

After mounting the target substrate W on the mounting stage 40, the mover 68 of the conveyor 60 is rotated in the orientation shown in FIG. 11. In this state, the mounting stage 40 is held at at least two places in the vertical direction by the lower holder 64 and the upper holder 66 of the conveyor 60 (see FIG. 7).

Then, the conveyor 60 is moved to a process chamber 30 for loading. When the conveyor 60 arrives in front of the process chamber 30 for loading, the gate valve 35 of the process chamber 30 for loading is opened.

Figure 4:
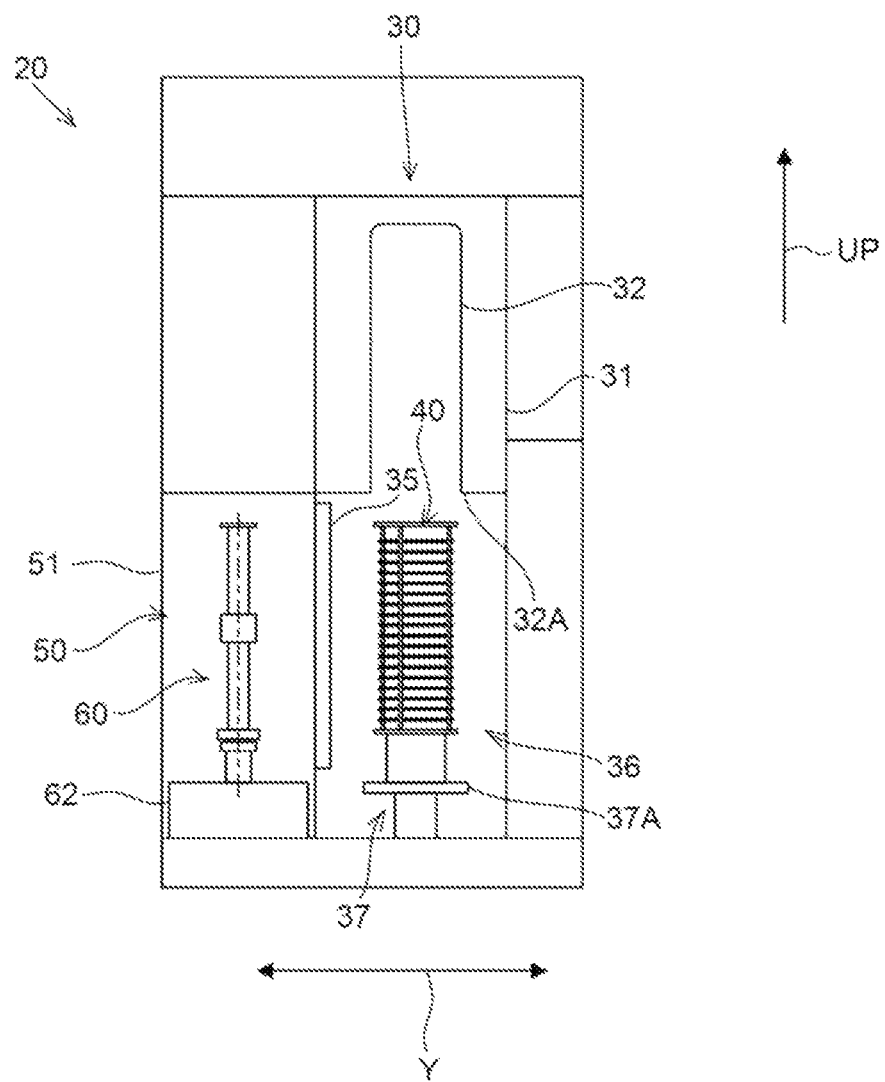
FIG. 4 is a front view showing the schematic configuration of the substrate processing apparatus of FIG. 3, showing a state in which the mounting stage is transferred from the conveyor to an elevator in a process chamber.
Figure 5:
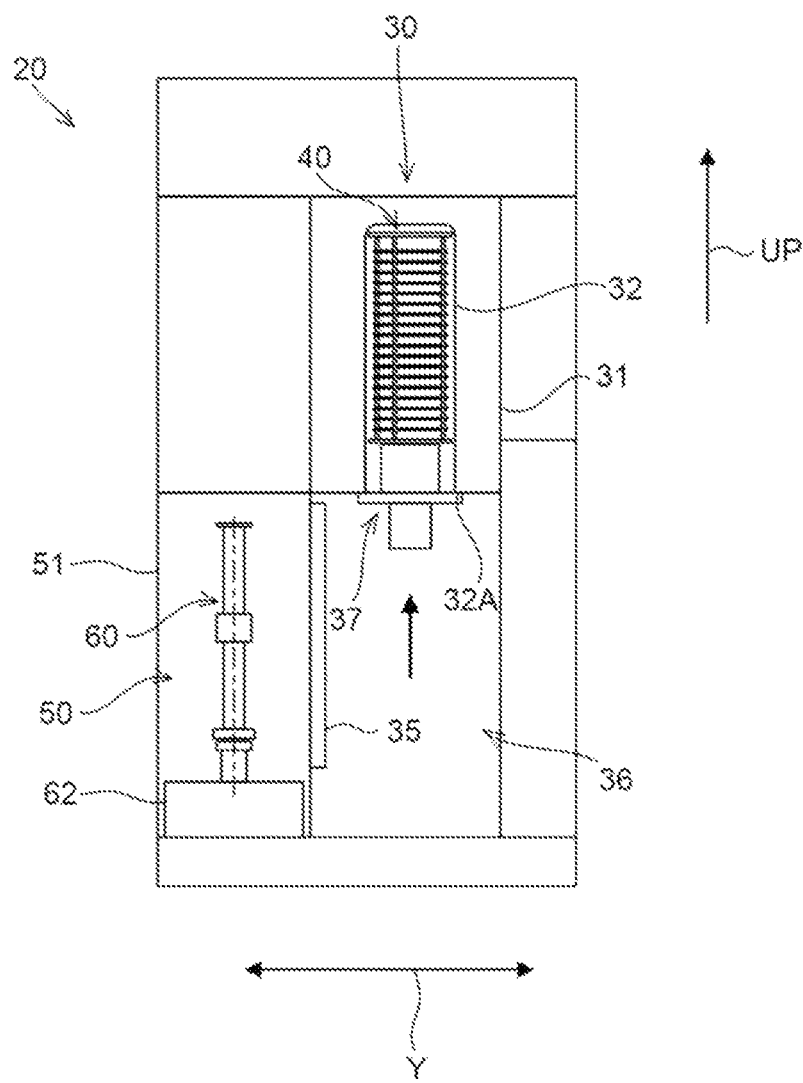
FIG. 5 is a front view showing a schematic configuration of the substrate processing apparatus of FIG. 4, showing a state in which the mounting stage mounted on the elevator is loaded into a reaction furnace of the process chamber.

After the gate valve 35 is opened, the mover 68 of the conveyor 60 is extended toward the transfer chamber 36, as shown in FIGS. 12 and 13. At this time, a height of the mover 68 is also adjusted. As a result, the mounting stage 40 is loaded into the process chamber 30 (the transfer chamber 36) via the entrance of the process chamber 30. The loaded mounting stage 40 is mounted on the elevating stage 37A of the elevator 37, as shown in FIG. 4. After that, the mover 68 is contracted and the gate valve 35 is closed. Next, the mounting stage 40 is lifted together with the elevating stage 37A of the elevator 37, such that the mounting stage 40 is charged into the reaction furnace 32 (see FIG. 5).

After the mounting stage 40 is charged into the reaction furnace 32, a process gas, an inert gas, and the like are supplied into the reaction furnace 32 while controlling an internal pressure and an internal temperature of the reaction furnace 32. As a result, the substrate W is subjected to a film-forming process.

Figure 14:
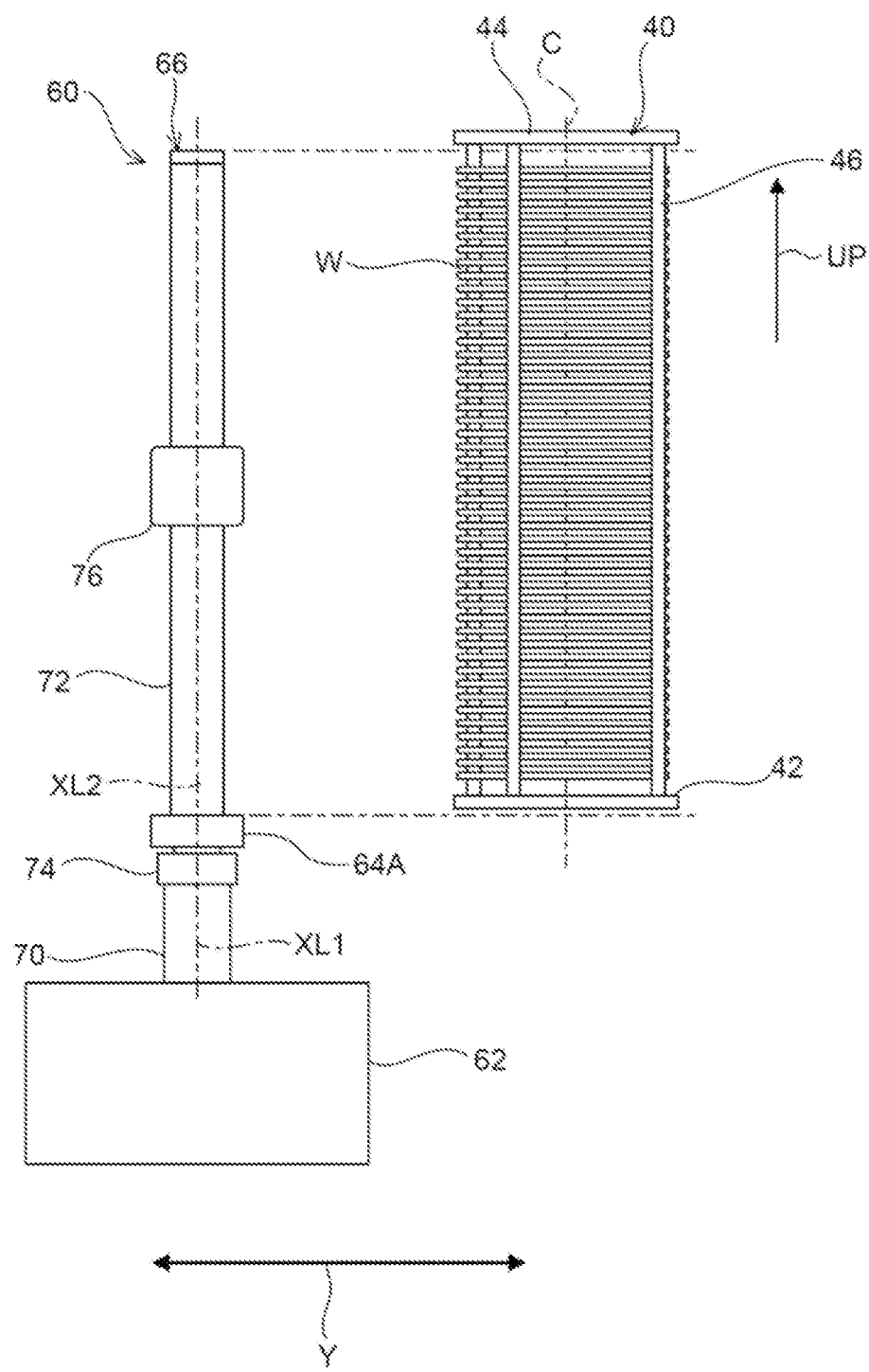
FIG. 14 is a front view of the conveyor, showing a state in which the conveyor arrived in front of the process chamber where a film-forming process is completed.

When the processing of the substrate W is completed, the conveyor 60 moves toward the process chamber 30. When the conveyor 60 arrives in front of a process chamber 30 for unloading, the gate valve 35 of the process chamber 30 for unloading is opened. At this time, the mounting stage 40 taken out of the reaction furnace 32 is lowered into the transfer chamber 36 together with the elevating stage 37A of the elevator 37 (see FIG. 14).

Figure 15:
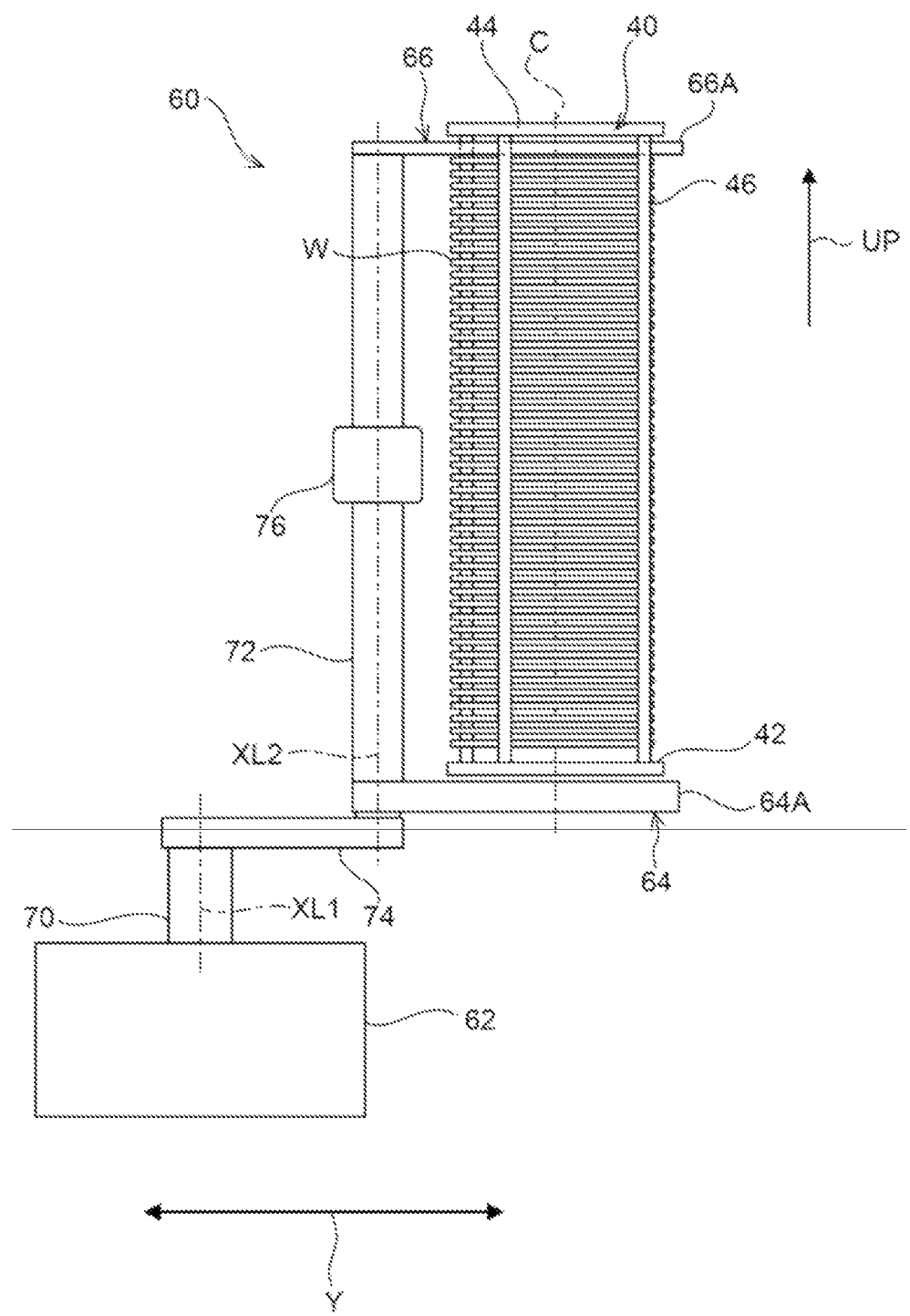
FIG. 15 is a front view of the conveyor of FIG. 14, showing a state in which the mover is extended to insert upper and lower holders into the mounting stage accommodated in the process chamber.
Figure 16:
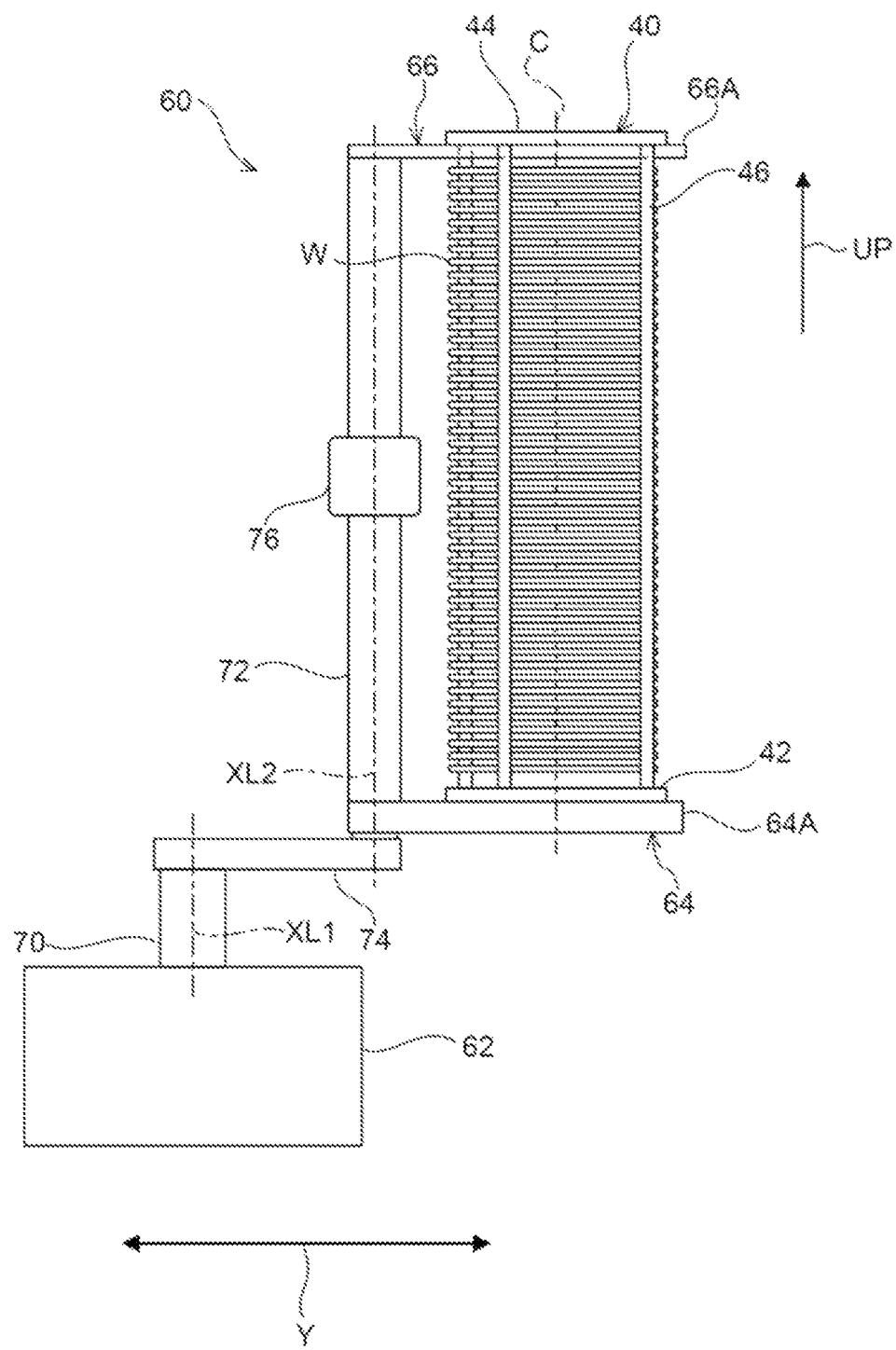
FIG. 16 is a front view of the conveyor of FIG. 15, showing a state in which the mover is moved upward to lift the mounting stage by the upper and lower holders.

Next, the mover 68 is extended toward the transfer chamber 36 at a height where the lower holder 64 and the upper holder 66 do not touch the bottom plate 42 and the ceiling plate 44 (see FIG. 15). After the lower holder 64 enters below the bottom plate 42 and the upper holder 66 enters below the ceiling plate 44, the mover 68 is raised. As a result, the bottom plate 42 is lifted by the lower holder 64 and the ceiling plate 44 is lifted by the upper holder 66. That is, the mounting stage 40 is lifted by the lower holder 64 and the upper holder 66 (see FIG. 16).

After that, the mover 68 is contracted to unload the mounting stage 40 from the process chamber 30. Then, with the center C of the mounting stage 40 and the shaft center XL1 of the rotary shaft 70 aligned, the mover 68 of the conveyor 60 is rotated in the orientation shown in FIG. 6. In this state, the mounting stage 40 is held at least two places in the vertical direction by the lower holder 64 and the upper holder 66 of the conveyor 60. Then, the conveyor 60 is moved to the transfer area 53 of the transport chamber 50. Next, the mover 68 of the conveyor 60 is rotated to orient the mounting stage 40 so that the transfer 84 may take out the substrate W. The transfer 84 transfers the processed substrate W from the mounting stage 40 to the accommodating container 80.

In this way, the film-forming process of the substrate W is performed to manufacture the semiconductor device.

Next, the operation and effects of the embodiments of the present disclosure will be described. In the embodiments of the present disclosure, since the conveyor 60 holds the mounting stage 40 at at least two places in the vertical direction, when the mounting stage 40 is transferred by the conveyor 60, it is possible to suppress a stress acting on the mounting stage 40 during acceleration and deceleration. This makes it possible to reduce displacement of the substrate W transferred to the mounting stage 40. As a result, it is possible to increase the transport speed of the conveyor 60, which may contribute to an improvement of productivity.

Further, in the embodiments of the present disclosure, the conveyor 60 includes the lower holder 64 and the upper holder 66 that hold the upper and lower sides of the mounting stage 40, respectively. Thus, it is possible to simplify the structure that holds the mounting stage 40, which may contribute to reduction of process costs. Moreover, it is possible to hold the mounting stage 40 without modifying the existing mounting stage.

Further, in the embodiments of the present disclosure, since the accommodating container 80, the load port 82, and the transfer 84 are provided, it is possible to transfer a plurality of types of substrates W to the mounting stage 40 by the transfer 84, which makes it possible to shorten a transfer time of the plurality of types of substrates W. Further, one type of substrate W may be accommodated in one container 80, and in the related art, the accommodating container 80 to be placed on the load port 82 is exchanged, for each type of substrate W to be transferred, to transfer the substrate W, which takes time to transfer the substrate W, but in the embodiments of the present disclosure, it is easy to transfer the substrate W in accordance with the substrate processing. By placing the accommodating container 80 in which the substrate W for substrate processing is accommodated, on the load port 82, it is possible to transfer the substrate W without waste.

In the embodiments of the present disclosure, the controller 100 checks the holding state of the mounting stage 40 by the conveyor 60 when transferring the substrate W. When the mounting stage 40 is being held, the controller 100 performs control to move the conveyor 60 to the transfer area 53. When the mounting stage 40 is not being held, the controller 100 acquires and holds the mounting stage 40 from the process chamber 30, and then performs control to move the conveyor 60 to the transfer area 53. When transferring the substrate W in this way, it is possible to reduce man-hours by checking the presence or absence of the mounting stage 40 in advance.

In the embodiments of the present disclosure, since the controller 100 may control the transfer of the conveyor 60 between the transfer area 53 and the process chamber 30 and may also control the transfer of the conveyor 60 between the process chamber 30 in which the substrate W is processed and another process chamber 30, it is possible to shorten transfer time of the mounting stage 40.

In the embodiments of the present disclosure, since the conveyor 60 includes the transport stage 62 and the mover 68 that may extend and contract in the horizontal and vertical directions with respect to the transport stage 62, it is possible to contribute to shortening the transfer time of the mounting stage.

In the embodiments of the present disclosure, since the mover 68 includes the rotary shaft 70 as the first rotator with the vertical direction as an axis and is rotated with respect to the transport stage 62 in the state where the center C of the mounting stage 40 and the shaft center XL1 of the rotary shaft 70 are aligned, a rotational stress acting on the substrate W mounted on the mounting stage 40 is reduced, such that the displacement of the substrate W due to the rotation of the mounting stage 40 may be prevented.

In the embodiments of the present disclosure, since the mover 68 includes the rotary shaft 72 with the vertical direction as an axis and rotates the rotary shaft 70 and the rotary shaft 72, it is possible to load/unload the mounting stage 40 into/from the process chamber 30. Here, rotating the rotary shaft 70 and the rotary shaft 72 at the same time may contribute to shortening expansion/contraction time of the arm 74.

In the embodiments of the present disclosure, since the rotary shaft 70 can be adjusted so that the mounting stage 40 and the lower holder 64/the upper holder 66 are arranged in the same condition with respect to the traveling direction of the conveyor 60, the transfer position of the substrate W is always a front in the traveling direction, a stress applied to the substrate W due to acceleration and deceleration of the conveyor 60 is in a constant direction.

In the embodiments of the present disclosure, the mounting stage 40 is held with respect to the transfer 84 in an orientation in which the substrate W may be transferred, as shown in FIG. 6. By adjusting the orientation of the mounting stage 40 in advance in this way, the transfer operation of the substrate W between the mounting stage 40 and the accommodating container 80 by the transfer 84 is facilitated.

In the embodiments of the present disclosure, by storing the distance information between the transfer area 53 and the process chamber 30 in the memory 101C, movement management of the conveyor 60 is facilitated. Further, when a new process chamber 30 is added, by storing distance information of the newly added process chamber 30 in the memory 101C, it is possible to easily move the conveyor 60 to the newly added process chamber 30.

In the embodiments of the present disclosure, the transport manager 130 receives instructions from the controller 100 and controls the conveyor 60. Therefore, a load on the controller 100 may be distributed.

In the embodiments of the present disclosure, since the conveyor 60 is configured to be capable of adjusting the center-of-gravity position of the mounting stage 40, it is possible to keep the center-of-gravity position of the mounting stage 40 constant even in a case where the mounting conditions of the substrate W are different when the mounting stage 40 is transferred. This enables stable transfer of the mounting stage 40 by the conveyor 60.

In the embodiments of the present disclosure, since the controller 100 instructs the transport manager 130 to move the balancer 76 of the conveyor 60 in the vertical direction to adjust the center-of-gravity position of the mounting stage 40 in accordance with the center-of-gravity position calculated by the center-of-gravity calculator 132, it is possible to always keep the center-of-gravity position of the mounting stage 40 constant even in a case where the mounting conditions of the substrate W are different when the mounting stage 40 is transferred. This enables stable transfer of the mounting stage 40 by the conveyor 60.

In the embodiments of the present disclosure, since the controller 100 monitors the state of the process chamber 30 and adjusts the transport schedule of the conveyor 60 according to the state of the process chamber 30, it is possible to reduce a yield of the conveyor 60 resulting from an abnormality in the process chamber 30.

Other Embodiments

The present disclosure is not limited to the above-described embodiments, and may be modified in various ways without departing from the gist of the present disclosure. For example, grooves into which the lower holder 64 and the upper holder 66 are fitted may be formed in the lower surfaces of the bottom plate 42 and the ceiling plate 44 of the mounting stage 40, respectively, and a locker with the holder may be provided at least one selected from the group of the bottom plate 42 and the ceiling plate 44.

Further, in the above-described embodiments, the mounting stage 40 is lifted by the lower holder 64 and the upper holder 66, but the present disclosure is not limited thereto. For example, the mounting stage 40 may be vertically sandwiched between the lower holder 64 and the upper holder 66.

Furthermore, in the above-described embodiments, the axes of the rotary shaft 70 and the rotary shaft 72 of the mover 68 of the conveyor 60 are set in the vertical direction, but the present disclosure is not limited thereto. For example, the axes of the rotary shaft 70 and the rotary shaft 72 may be set in the horizontal direction.

According to the present disclosure in some embodiments, it is possible to suppress displacement of a substrate when a mounting stage on which the substrate is mounted is transported and stopped.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus comprising:
    at least one process chamber in which at least one substrate is processed;
    a mounting stage configured to be capable of mounting the at least one substrate on the mounting stage;
    a transport chamber including a transfer area configured to be capable of transferring the at least one substrate to the mounting stage and a conveyor configured to be capable of holding the mounting stage at at least two places in a vertical direction and transporting the mounting stage;
    a load port configured to be capable of mounting an accommodating container capable of accommodating the at least one substrate;
    a transfer unit configured to be capable of transferring the at least one substrate between the accommodating container mounted on the load port and the transport chamber; and
    a controller configured to be capable of performing transport control of the conveyor in the transport chamber, wherein the performing the transport control includes:
        checking a holding state of the mounting stage by the conveyor when the at least one substrate is transferred;
        controlling the conveyor to move to the transfer area when the mounting stage is being held; and
        acquiring and holding the mounting stage from the at least one process chamber and then controlling the conveyor to move to the transfer area when the mounting stage is not being held.

2. The substrate processing apparatus of claim 1, wherein the conveyor includes holders configured to be capable of holding an upper side and a lower side of the mounting stage respectively.

3. The substrate processing apparatus of claim 1, wherein the at least one process chamber includes a plurality of process chambers, and
    wherein the controller is configured to be capable of performing transport control of the conveyor between the transfer area and the at least one process chamber and further configured to be capable of performing transport control of the conveyor between one process chamber of the plurality of process chambers in which the at least one substrate is processed and another process chamber of the plurality of process chambers.

4. The substrate processing apparatus of claim 1, wherein the conveyor includes a transport stage and a mover that is installed at the transport stage and is configured to be capable of expanding and contracting in a horizontal direction and the vertical direction with respect to the transport stage.

5. The substrate processing apparatus of claim 4, wherein the mover includes a first rotator with an axis in the vertical direction and is configured to be capable of rotating with respect to the transport stage with a center of the mounting stage aligned with the axis of the first rotator.

6. The substrate processing apparatus of claim 5, wherein the mover includes a second rotator with an axis in the vertical direction and is configured to be capable of loading and unloading the mounting stage into and from the at least one process chamber by rotating the first rotator and the second rotator.

7. The substrate processing apparatus of claim 5, wherein the first rotator is configured to be capable of being regulated such that the mounting stage and a holder that holds the mounting stage are arranged under the same arrangement condition with respect to a travelling direction of the conveyor.

8. The substrate processing apparatus of claim 1, wherein the mounting stage is held in such an orientation that the at least one substrate is capable of being transferred to the transfer unit.

9. The substrate processing apparatus of claim 1, further comprising: a memory configured to be capable of storing distance information between the transfer area and the at least one process chamber,
    wherein the controller is configured to be capable of acquiring distance information of a target process chamber of the at least one process chamber from the memory, and controlling a movement distance of the conveyor based on the acquired distance information.

10. The substrate processing apparatus of claim 1, wherein the controller includes a transport manager configured to be capable of controlling the conveyor, and
    wherein the transport manager is configured to be capable of receiving an instruction from the controller and controlling the conveyor.

11. The substrate processing apparatus of claim 10, wherein the conveyor is configured to be capable of regulating a center-of-gravity position of the mounting stage.

12. The substrate processing apparatus of claim 11, wherein the controller includes a center-of-gravity calculator capable of regulating and managing the center-of-gravity position of the mounting stage in the vertical direction, and
wherein the center-of-gravity calculator is configured to be capable of calculating the center-of-gravity position according to a mounting state of the at least one substrate mounted on the mounting stage.

13. The substrate processing apparatus of claim 12, wherein the controller is configured to be capable of instructing the transport manager to move a balancer of the conveyor in the vertical direction in accordance with the center-of-gravity position calculated by the center-of-gravity calculator, and regulate the center-of-gravity position of the mounting stage.

14. The substrate processing apparatus of claim 1, wherein the controller monitors a state of the at least one process chamber and regulates a transport schedule of the conveyor according to the state of the at least one process chamber.

15. A method of processing a substrate by using a substrate processing apparatus that comprises:
at least one process chamber in which at least one substrate is processed;
a mounting stage configured to be capable of mounting the at least one substrate on the mounting stage;
a transport chamber including a transfer area configured to be capable of transferring the at least one substrate to the mounting stage and a conveyor configured to be capable of holding the mounting stage at at least two places in a vertical direction and transporting the mounting stage;
a load port configured to be capable of mounting an accommodating container capable of accommodating the at least one substrate; and
a transfer configured to be capable of transferring the at least one substrate between the accommodating container mounted on the load port and the transport chamber,
wherein the method comprises:
mounting the at least one substrate on the mounting stage;
holding the mounting stage at the at least two places in the vertical direction by using the conveyor;
transporting the mounting stage by using the conveyor; and
processing the at least one substrate in the at least one process chamber, and
wherein the act of transporting the mounting stage comprises:
checking a holding state of the mounting stage by the conveyor when the at least one substrate is transferred;
controlling the conveyor to move to the transfer area when the mounting stage is being held; and
acquiring and holding the mounting stage from the at least one process chamber and then controlling the conveyor to move to the transfer area when the mounting stage is not being held.

16. A method of manufacturing a semiconductor device, comprising the method of claim 15.

17. A non-transitory computer-readable recording medium storing a program that is capable of causing, by a computer, a substrate processing apparatus to perform a process,
wherein the substrate processing apparatus comprises:
at least one process chamber in which at least one substrate is processed;
a mounting stage configured to be capable of mounting the at least one substrate on the mounting stage;
a transport chamber including a transfer area configured to be capable of transferring the at least one substrate to the mounting stage and a conveyor configured to be capable of holding the mounting stage at at least two places in a vertical direction and transporting the mounting stage;
a load port configured to be capable of mounting an accommodating container capable of accommodating the at least one substrate; and
a transfer configured to be capable of transferring the at least one substrate between the accommodating container mounted on the load port and the transport chamber,
wherein the process comprises:
mounting the at least one substrate on the mounting stage;
holding the mounting stage at the at least two places in the vertical direction by using the conveyor;
transporting the mounting stage by using the conveyor; and
processing the at least one substrate in the at least one process chamber, and
wherein the transporting the mounting stage comprises:
checking a holding state of the mounting stage by the conveyor when the at least one substrate is transferred;
controlling the conveyor to move to the transfer area when the mounting stage is being held; and
acquiring and holding the mounting stage from the at least one process chamber and then controlling the conveyor to move to the transfer area when the mounting stage is not being held.

* * * * *